(12) United States Patent
Takizawa et al.

(10) Patent No.: US 8,154,294 B2
(45) Date of Patent: Apr. 10, 2012

(54) MAGNETIC RESONANCE IMAGING APPARATUS AND METHOD FOR CORRECTING ERROR DUE TO GRADIENT MAGNETIC FIELD

(75) Inventors: Masahiro Takizawa, Tokyo (JP); Tetsuhiko Takahashi, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 353 days.

(21) Appl. No.: 12/601,378

(22) PCT Filed: Jun. 3, 2008

(86) PCT No.: PCT/JP2008/060178
§ 371 (c)(1),
(2), (4) Date: Nov. 23, 2009

(87) PCT Pub. No.: WO2008/152937
PCT Pub. Date: Dec. 18, 2008

(65) Prior Publication Data
US 2010/0164495 A1    Jul. 1, 2010

(30) Foreign Application Priority Data
Jun. 14, 2007    (JP) ............................ 2007-157303

(51) Int. Cl.
*G01V 3/00* (2006.01)

(52) U.S. Cl. ...................................... 324/318; 324/309
(58) Field of Classification Search .......... 324/300–322; 600/407–445
See application file for complete search history.

(56) References Cited

U.S. PATENT DOCUMENTS

| | | | | |
|---|---|---|---|---|
| 5,545,993 | A * | 8/1996 | Taguchi et al. | 324/309 |
| 6,842,000 | B2 * | 1/2005 | Norris et al. | 324/309 |
| 7,859,262 | B2 * | 12/2010 | Jellus | 324/309 |
| 2006/0116569 | A1 | 6/2006 | Yamazaki | |
| 2010/0123460 | A1 * | 5/2010 | Hughes et al. | 324/309 |
| 2011/0152668 | A1 * | 6/2011 | Stemmer | 600/413 |

FOREIGN PATENT DOCUMENTS

| | | |
|---|---|---|
| JP | 2005-152175 | 6/2005 |
| JP | 2006-149930 | 6/2006 |
| WO | WO2005/023108 A1 | 3/2005 |
| WO | WO2007/013423 A1 | 2/2007 |

* cited by examiner

*Primary Examiner* — Brij Shrivastav
(74) *Attorney, Agent, or Firm* — Cooper & Dunham LLP

(57) ABSTRACT

In a non-cartesian sampling method, in order to reduce an artifact on an image caused by an error of a gradient magnetic field, data for correcting the error caused by the gradient magnetic field are obtained when data used for image reconstruction are obtained, and the data used for the image reconstruction are corrected by using the obtained data for the correction. In order to obtain the data for correcting the error, a block having plural parallel echo signals is measured.

15 Claims, 14 Drawing Sheets (a)

(b)

(c)

(a)

(b)

(c)

MAGNETIC RESONANCE IMAGING APPARATUS AND METHOD FOR CORRECTING ERROR DUE TO GRADIENT MAGNETIC FIELD

TECHNICAL FIELD

The present invention relates to an magnetic resonance imaging apparatus (hereinafter referred to as "MRI") for obtaining a tomogram of an examination site of an examinee by utilizing a nuclear magnetic resonance (hereinafter referred to as "NMR") phenomenon, and particularly to a technique of reducing an artifact based on a measuring method of radially sampling a measurement space (K space).

BACKGROUND ART

When an examinee moves during an imaging operation in an MRI apparatus for obtaining a tomogram of an examination site of the examinee by using the NMR phenomenon, the effect extends to the overall image, and such an artifact that an image streams in a phase encode direction (hereinafter referred to as "body movement artifact") occurs. This is because when an echo signal at each lattice point on a measurement space (K space) is sampled, the sampling which is parallel to a frequency encode direction is repeated in a phase encode direction. Such a measuring method will be hereinafter referred to as an orthogonal system (Cartesian) sampling method.

In addition to the orthogonal system (Cartesian) sampling method, a non-orthogonal system (Non-Cartesian) sampling method is known. There are representatively known a radial sampling method (see non-patent document 1, for example), and a hybrid radial method or propeller MRI method which corresponds to the combination of the radial sampling method with a phase encode (see non-patent document 2, for example).

The radial sampling method is a technique of radially scanning a measurement space to sample data while the rotation angle is varied with substantially one point (generally, origin) of the measurement space set as a rotation center, thereby obtaining echo signals required to reconstruct one image. When imaging is performed by using the radial sampling method, a body movement artifact is scattered around an image because sampling is radially executed, and thus the artifact concerned gets out of a visual field to be noted. Therefore, as compared with the imaging based on orthogonal system sampling method, the body movement artifact is inconspicuous, and it called as being robust to the body movement.

In the radial sampling method, the distribution of a reading gradient magnetic field in an imaging plane is different among echo signals because the measurement space is radially scanned. Accordingly, the effects of non-uniformity of a magnetostatic field distribution and non-linearity of the gradient magnetic field are different among echo signals. Furthermore, an applied amount of the gradient magnetic field which is pre-calculated without any regard for non-linearity of the gradient magnetic field and offset is different from an actually applied amount of the gradient magnetic field, and thus echo signals cannot be arranged at accurate coordinates of the measurement space. From these circumstances, the radial sampling method has a problem that an artifact caused by non-linearity of the gradient magnetic field or the like is more liable to occur in an image as compared with the orthogonal system sampling method.

There is known a method of measuring the non-linearity of the gradient magnetic field in advance before execution of a sequence and reflecting it to an actual measurement in order to correct the artifact in the radial sampling method (see non-patent document 3, for example).

Non-patent document 1: G. H. Glover et. al., Projection Reconstruction Techniques for Reduction of Motion Effects in MRI, Magnetic Resonance in Medicine 28: 275-289 (1992)

Non-patent document 2: James G. Pipe, Motion Correction with PROPELLER MRI: Application to Head Motion and Free-Breathing Cardiac Imaging, Magnetic Resonance in Medicine 42: 963-969 (1999)

Non-patent document 3: D. C. Peters et. al., Centering the Projection Reconstruction Trajectory: Reducing Gradient Delay Errors, Magnetic Resonance in Medicine 50: 1-6 (2003)

DISCLOSURE OF THE INVENTION

Problems that the Invention is to Solve

In the method disclosed in the non-patent document 3, a superfluous measurement to measure the non-linearity of the gradient magnetic field is required, and thus the total imaging time is extended.

The present invention has been implemented in view of the foregoing situation, and has an object to reduce an artifact on an image due to an error caused by a gradient magnetic field with suppressing extension of an imaging time in a non-orthogonal sampling method.

Means of Solving the Problem

According to the present invention, when data used to reconstruct an image are obtained in a non-orthogonal sampling method, data for correcting an error caused by a gradient magnetic field are obtained, and the error caused by the gradient magnetic field is corrected by using the obtained data for the correction. At least one block having plural parallel echo signals is measured to obtain the data for correcting the error.

Specifically, an MRI apparatus according to the present invention comprises a measurement controller for controlling application of a gradient magnetic field and measurement of echo signals arranged in a K space on the basis of a pulse sequence of a non-cartesian sampling method; a correcting processor for correcting an error caused by the gradient magnetic field; and a calculation processor for subjecting K space data to calculation processing to reconstruct an image, wherein the measurement controller controls the application of the gradient magnetic field so as to measure a block comprising plural echo signals arranged in parallel to one another on the K space, and the correcting processor detects a shift amount of a peak position of an echo signal group of the block from an origin of the K space and correcting the error caused by the gradient magnetic field on the basis of the shift amount.

Furthermore, specifically, a method of correcting an error caused by a gradient magnetic field according to the invention is a correcting method for correcting an error caused by a gradient magnetic field in a pulse sequence of a non-cartesian sampling method by using a block comprising plural echo signals arranged in parallel on a K space, and comprises a detection step of detecting a shift amount of a peak position of an echo signal group of the block from an origin of the K space and a correction step of correcting the error caused by the gradient magnetic field on the basis of the detected shift amount.

Accordingly, the error caused by the gradient magnetic field is corrected by using the shift amount, which occurs due to the gradient magnetic field, of the peak position of the echo signals measured in the non-cartesian sampling method from the origin of the K space, so that an artifact on an image which occurs due to the gradient magnetic field error can be reduced.

Effect of the Invention

According to the present invention, the artifact on the image due to the error caused by the gradient magnetic field can be reduced with suppressing extension of an imaging time in the non-cartesian sampling method.

Figure 1:
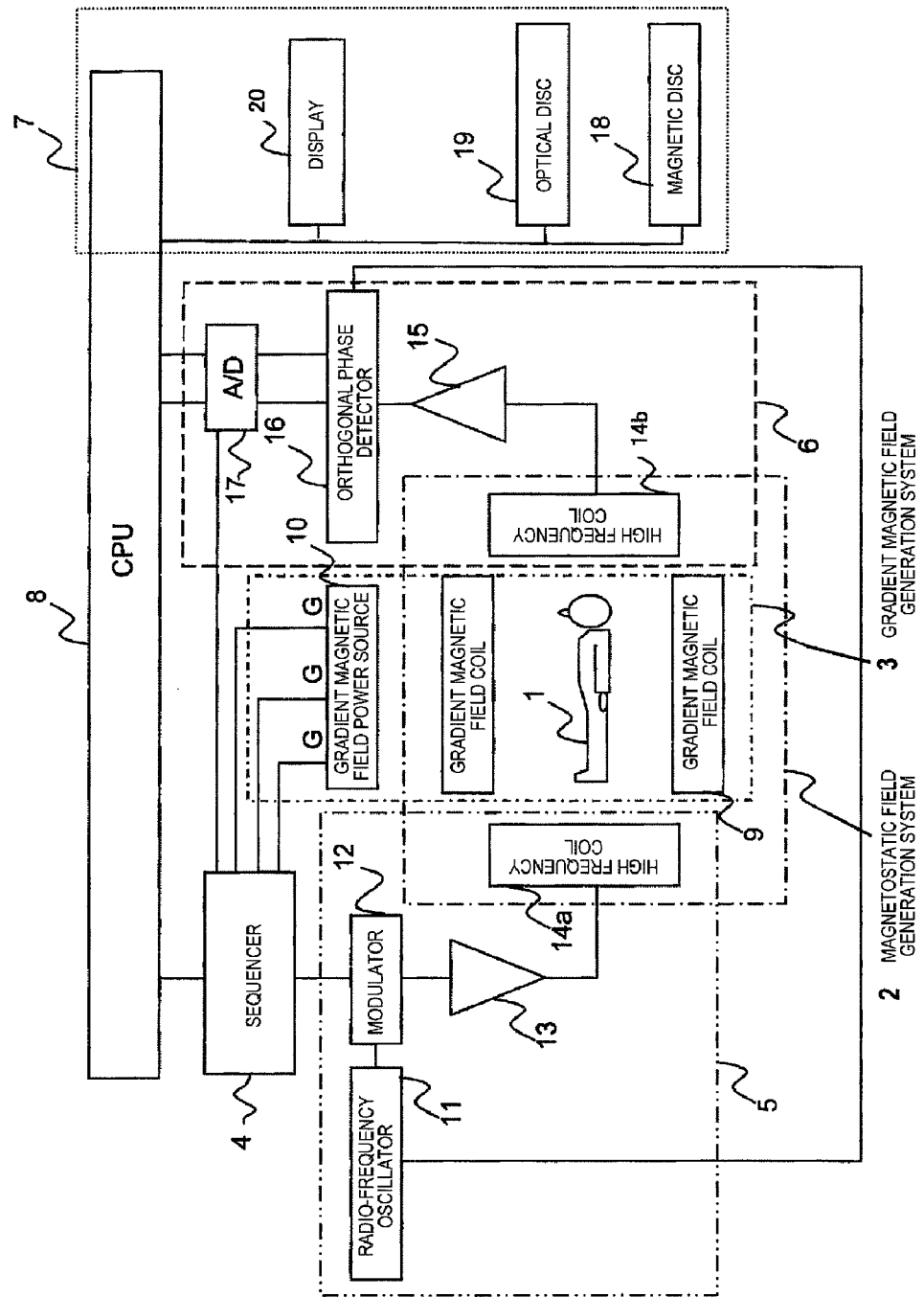
FIG. 1 is a block diagram showing an MRI apparatus according to a first embodiment of the present invention.

DESCRIPTION OF REFERENCE NUMERALS 1 examinee, 2 magnetostatic field generation system, 3 gradient magnetic field generation system, 4 sequencer, 5 transmission system, 6 reception system, 7 signal processing system, 8 central processing unit (CPU), 9 gradient magnetic field coil, 10 gradient magnetic field power source, 11 radio-frequency oscillator, 12 modulator, 13 radio-frequency amplifier, 14a radio-frequency coil (transmission side), 14b radio-frequency coil (reception side), 15 amplifier, 16 orthogonal phase detector, 17 A/D converter, 18 magnetic disk, 19 optical disc, 20 display, 501 radio-frequency pulse, 502 slice selecting gradient magnetic field, 503 phase encode gradient magnetic field pulse, 504 frequency encode gradient magnetic field pulse, 505 data sample window, 506 echo signal, 507 repeat time interval, 508 image obtaining time

BEST FOR CARRYING OUT THE INVENTION

<<First Embodiment>>

A first embodiment according to the present invention will be described with reference to the drawings. Elements having the same functions are represented by the same reference numerals in all the figures for describing embodiments, and the repetitive description thereof is omitted.

FIG. 1 is a block diagram showing the overall construction of an MRI apparatus 20 according to this embodiment. The MRI apparatus 20 obtains tomograms of an examinee by using the NMR phenomenon. As shown in FIG. 1, the MRI apparatus 20 has a magnetostatic field generation system 2, a gradient magnetic field generation system 3, a transmission system 5, a reception system 6, a signal processing system 7, a sequencer 4 and a central processing unit (CPU) 8.

The magnetostatic field generating system 2 generates a uniform magnetostatic field in a body axis direction of an examinee 1 or in a direction orthogonal to the body axis in a space around the examinee 1, and magnetic generating means of a permanent magnet type, a normal conduction type or a superconduction type is disposed around the examinee 1.

The gradient magnetic field generation system 3 has gradient magnetic field coils 9 wound around in three-axis directions of X, Y and Z, and gradient magnetic field power sources 10 for driving these gradient magnetic field coils respectively, and drives the gradient magnetic field power sources 10 for the respective coils according to an instruction from the sequencer, 4 described later, whereby gradient magnetic fields Gx, Gy, Gz in the three axis directions of X, Y and Z are applied to the examinee 1. In general, a slice-direction gradient magnetic field pulse (Gs) is applied in any one direction of X, Y and Z to set a slice plane for the examinee 1, and a phase encode direction gradient magnetic field pulse (Gp) and a frequency encode direction gradient magnetic field pulse (Gf) are applied in the other two directions, whereby position information of the respective directions is encoded to echo signals.

The sequencer 4 repetitively applies a radio-frequency magnetic field pulse (hereinafter referred to as "RF pulse") and a gradient magnetic field pulse at a predetermined pulse sequence, and it is operated under the control of the CPU 8 and transmits various kinds of commands required for data collection of tomogram images of the examinee 1 to the transmission system 5, the gradient magnetic field generation system 3 and the reception system 6. The pulse sequence is a time chart of a combination of on/off timing, amplitude, etc. of the RF pulse, the gradient magnetic field pulse, etc. The pulse sequence is predetermined according to a purpose of imaging, and stored as a program in a memory (not shown) or the like. The CPU 8 controls the sequencer 4 according to the pulse sequence.

The transmission system 5 irradiates the RF pulse for inducing nuclear magnetic resonance to nuclear spins of atoms constituting a living tissue of the examinee 1, and it has a radio-frequency oscillator 11, a modulator 12, a radio-frequency amplifier 13 and a transmission-side radio-frequency coil (transmission coil) 14a. A radio-frequency pulse output from the radio-frequency oscillator 11 is amplitude-modulated by the modulator 12 at the timing based on an instruction from the sequencer 4. This amplitude-modulated radio-frequency pulse is amplified in the radio-frequency amplifier 13, and then supplied to the transmission coil 14a disposed in proximity to the examinee 1, thereby irradiating the examinee 1 with an electromagnetic wave (RF pulse).

The reception system 6 detects an NMR signal (echo signal) discharged through the nuclear magnetic resonance of the atomic nuclear spins constituting the living body of the examinee 1, and has a reception-side radio-frequency coil (reception coil) 14b, an amplifier 15, an orthogonal phase detector 16 and an A/D converter 17. An electromagnetic wave (NMR signal) of a response of the examinee 1 which is induced by an electromagnetic wave irradiated from the transmission coil 14a is detected by the reception coil 14b disposed in proximity to the examinee 1, amplified in the amplifier 15 and then divided into orthogonal signals of two systems by the orthogonal phase detector 16 at the timing based on an instruction from the sequencer 4. Each of the thus-divided orthogonal signals is converted to a digital amount by the A/D converter 17 and then transmitted to the signal processing system 7.

The signal processing system 7 has an optical disc 19, an external storage device such as a magnetic disc 18, and a display 20 comprising CRT or the like. When data are input from the reception system 6 into the CPU 8, the CPU 8 executes processing such as signal processing, and image reconstruction, and displays a tomogram of the examinee 1 as the processing result in the display 20. In addition, the CPU 8 records the tomogram into the magnetic disc 18 or the like as the external recording device.

In FIG. 1, the radio-frequency coils 14a and 14b at the transmission side and the reception side and the gradient magnetic field coils 9 are disposed in the magnetostatic field space of the magnetostatic field generating system 2 disposed in the space around the examinee 1.

An clinically prevailing imaging target spin type of the present MRI apparatus is proton as a main constituent material of the examinee. The morphology (shapes) or functions of a head region, an abdominal region, extremities, etc. of a human body are two-dimensionally or three-dimensionally imaged by imaging a spatial distribution of proton density and a spatial distribution of a relaxation phenomenon of an excited state.

Next, the imaging operation executed in the MRI apparatus 20 will be described. The CPU 8 makes the sequencer 4 execute the following processing according to a program which is held in a memory (not shown) or the like in advance. In the MRI apparatus 20, the orthogonal system sampling method and the non-cartesian sampling method are implemented by controlling application of the gradient magnetic field.

Figure 2:
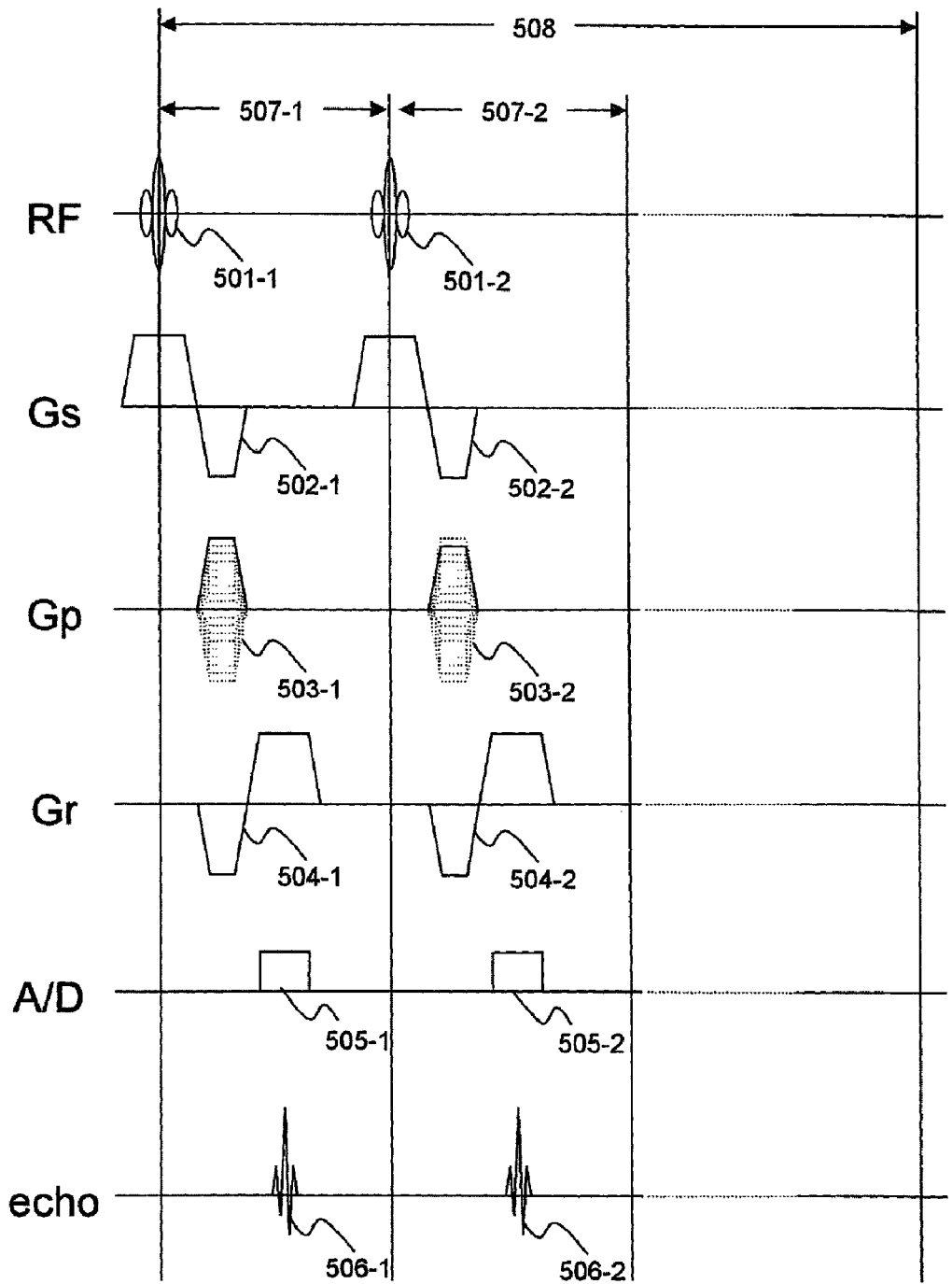
FIG. 2 is a gradient echo pulse sequence of an orthogonal sampling method.

First, the imaging based on the orthogonal system sampling method will be described. FIG. 2 shows a gradient echo pulse sequence of the orthogonal system sampling method. RF, Gs, Gp, Gr, A/D and echo of FIG. 2 represents the axes of the RF pulse, the slice gradient magnetic field, the phase encode gradient magnetic field, the frequency encode gradient magnetic field (reading gradient magnetic field), the AD conversion and the echo signal respectively, 501 represents RF pulses, 502 represents slice selecting gradient magnetic field pulses, 503 represents phase encode gradient magnetic field pulses, 504 represents frequency encode gradient magnetic field pulses, 505 represents sampling windows, 506 represents echo signals and 507 represents a repeat time (the interval of the RF pulses 501). The abscissa axis represents the time axis.

The applied amount of the phase encode gradient magnetic field pulse 503 (=the area surrounded by the gradient magnetic field pulse wave form and the time axis) is varied every repeat time TR507 to give different phase encode amounts, and the echo signals 506 obtained on the basis of the respective phase encodes are detected. This operation is repeated at the frequency corresponding to the number of the phase encodes, and echo signals required to reconstruct one image are obtained in an image obtaining time 508. Normally, value of 64, 128, 256, 512 or the like is selected as the number of phase encodes every image. Each echo signal is normally obtained as a time-series signal comprising 128, 256, 512, 1024 sampling data. These data are subjected to two-dimensional Fourier Transform to create one MR image.

Figure 3:
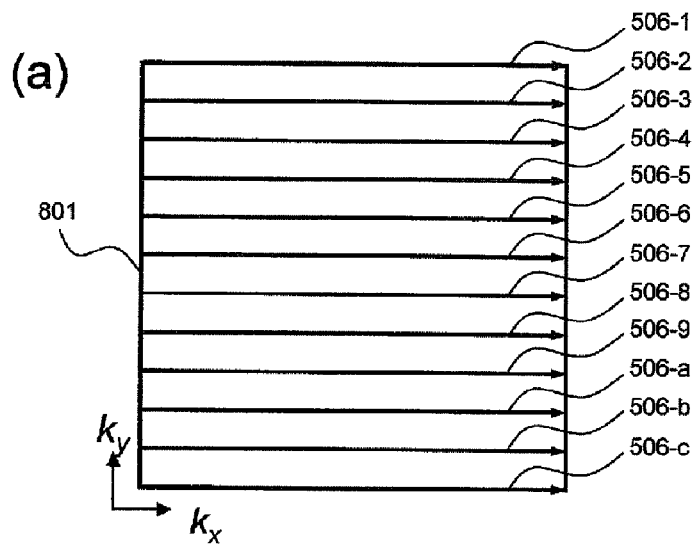
FIG. 3 is a diagram showing echo signals arranged in a measurement space.
Figure 3:
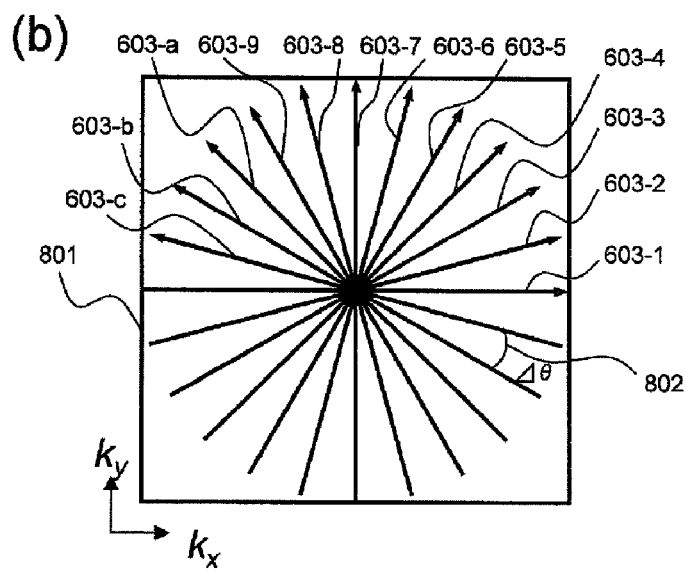
Figure 3:
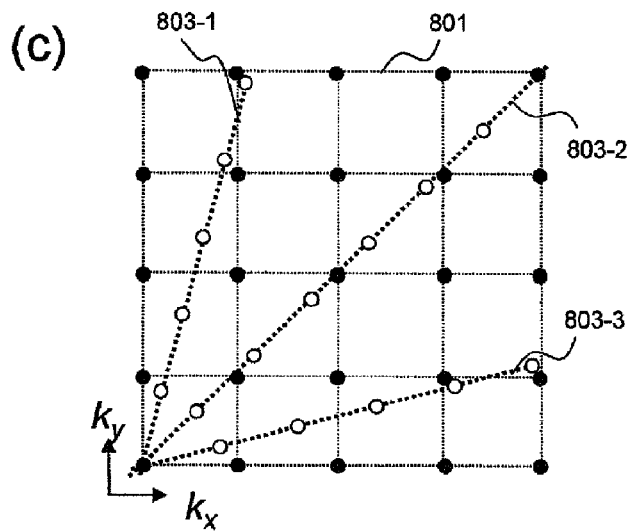

FIG. 3(a) shows an aspect that the echo signals sampled by using the pulse sequence shown in FIG. 2 are arranged in the measurement space (K space). For simplification of the description, FIG. 3(a) shows a case where the sequence between the TR507 is repeated at 12 times to obtain respective echo signals 506-1 to 506-c. The subscript of each echo signal corresponds to the time order of obtaining the echo signals (the frequency of TR507, subsequently called as "repeat number"). That is, it means that the time at which the echo signal is obtained is earlier as the number of the subscript is smaller, whereas the time at which the echo signal is obtained is later as the number is larger. The same is applied to the description of the subscripts in the following description. FIG. 3(a) shows an example when the phase encode amount is controlled so that the echo signal group 506-1 to 506-c are successively arranged from the upper side in a Ky direction of a measurement space 801.

Figure 4:
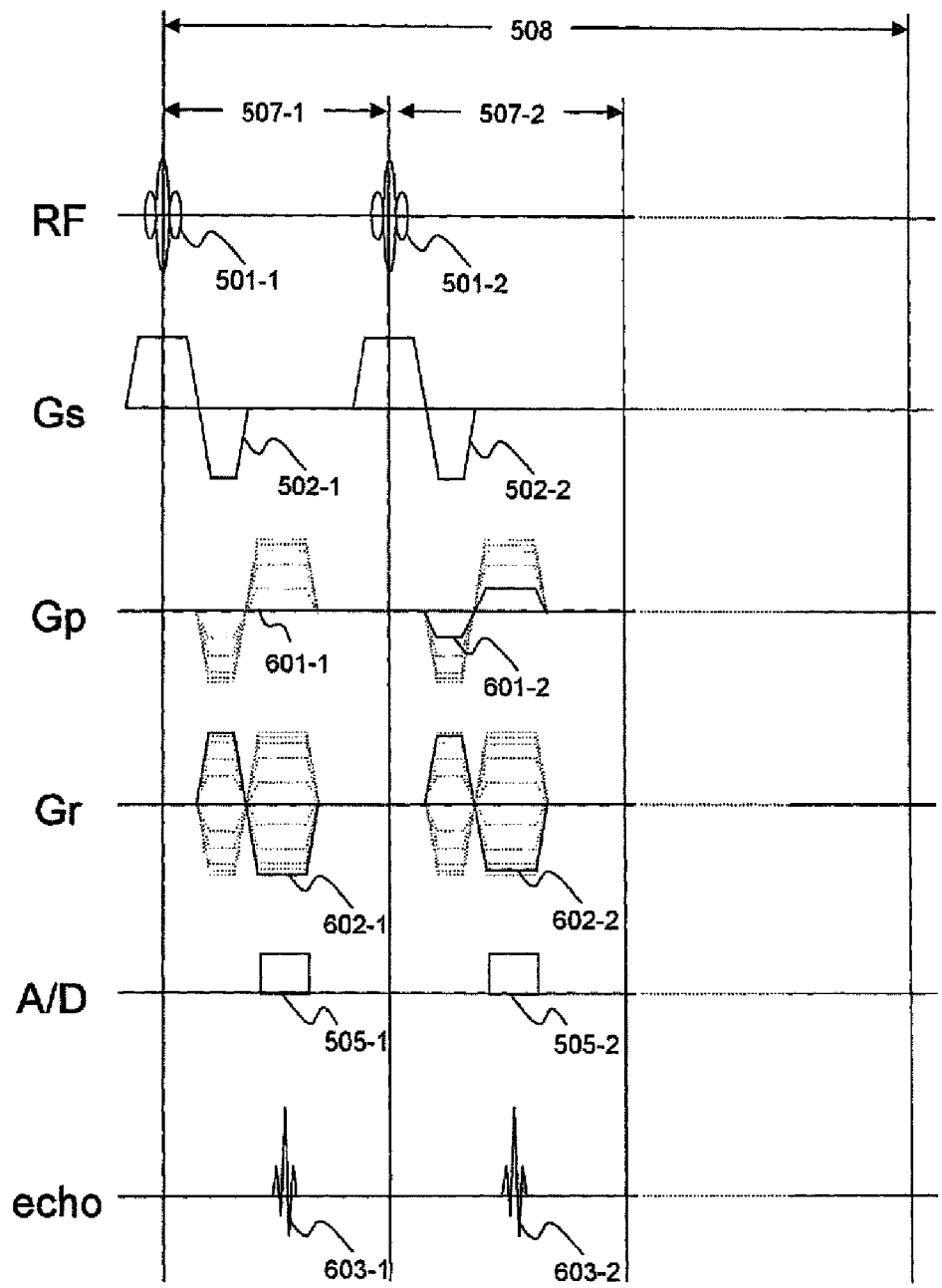
FIG. 4 is a gradient echo pulse sequence of a radial sampling method.

Next, the imaging operation based on the non-cartesian sampling method will be described. In this case, the radial sampling method in the non-cartesian sampling method will be described as an example. FIG. 4 shows a gradient echo pulse sequence of the radial sampling method. This is basically the same as the orthogonal system sampling method shown in FIG. 2. In the radial sampling method, the phase encode gradient magnetic field and the frequency encode gradient magnetic field are combined with each other, and applied while the ratio in magnitude (amplitude) therebetween is varied every repetitive TR507. A phase encode gradient magnetic field 601 and a frequency encode gradient magnetic field 602 which are different in amplitude are applied at each repeat TR507 of the pulse sequence, thereby obtaining data which are radially sampled with substantially one point of the measurement space set as the center.

FIG. 3(b) shows an arrangement result when the echo signals sampled by using the pulse sequence shown in FIG. 4 are arranged in the measurement space. For simplification of description, FIG. 3(b) shows a case where the sequence between TR507 is repeated at 12 times and respective echo signals 603-1 to 603-c are obtained. In order to uniformly embed the measurement space with the echo signals 603-1 to 603-c, an angle (rotational angle) $\Delta\theta$ (802) between each echo signal and an adjacent echo signal is set to be equal. In this case, the rotational angle $\Delta\theta$ is represented as follows (expression 1).

$$\Delta\theta = \pi/12 \quad \text{(expression 1)}$$

Assuming that the repeat number is represented by n ($1 \leq n \leq 12$) and the echo signal for n=1 is arranged in a Kx axis direction of the measurement space, an intersecting angle (rotational angle) $\theta(n)$ of the n-th echo signal to the Kx-axis is represented as follows (expression 2).

$$\theta(n) = \Delta\theta \times (n-1) \quad \text{(expression 2)}$$

At this time, the output of the n-th gradient magnetic field $Gp(\theta(n))$ in the phase encode axis and the output of the n-th gradient magnetic field $Gr(\theta(n))$ in the frequency encode axis are represented by the following expressions (expression 3) and (expression 4) when the output of the frequency encode gradient magnetic field used in the orthogonal system sampling method is represented by G.

$$Gp(\theta(n)) = G \times \sin(\theta(n)) \quad \text{(expression 3)}$$

$$Gr(\theta(n)) = G \times \cos(\theta(n)) \quad \text{(expression 4)}$$

Normally, the data obtained by the radial sampling method are not arranged on the lattice points of the orthogonal system coordinate of the measurement space. Therefore, gridding processing of subjecting sampled data to interpolation processing to create data on the lattice points of the orthogonal system coordinate is executed. FIG. 3(c) is a schematic diagram showing the relation between the data obtained by the non-cartesian sampling method and the measurement space. The lattice points of the orthogonal system coordinate of the measurement space 801 are represented by filled circles in FIG. 3(c), and data 803-1 to 803-3 obtained by the radial sampling method are represented by open circles in FIG. 3(c). As shown in FIG. 3(c), the sampled data are arranged at positions different from the lattice points of the measurement space 801. Through the gridding processing, the sampled data are subjected to the interpolation processing, and the data are re-arranged on the respective lattice points of the orthogonal system coordinate. The gridding processing is executed by using an interpolating function such as Sinc function or Kaiser-Bessel function (see non-patent document 4, for example).

Non-patent document 4: J. I Jackson et. al., Selection of a Convolution Function for Fourier Inversion Using Gridding, IEEE Trans. Med. Imaging, vol. 10, pp. 473-478, 1991

Next, an effect of hardware errors such as non-uniformity of magnetostatic field, non-linearity and offset of gradient magnetic field on echo signals and shift of sampled data due to the effect will be described. The following description will be made by applying to a case where gradient magnetic field offset occurs in the frequency encode (reading) gradient magnetic field and the phase encode gradient magnetic field due to the above hardware error. The description will be made by using the orthogonal system sampling method.

Figure 5:
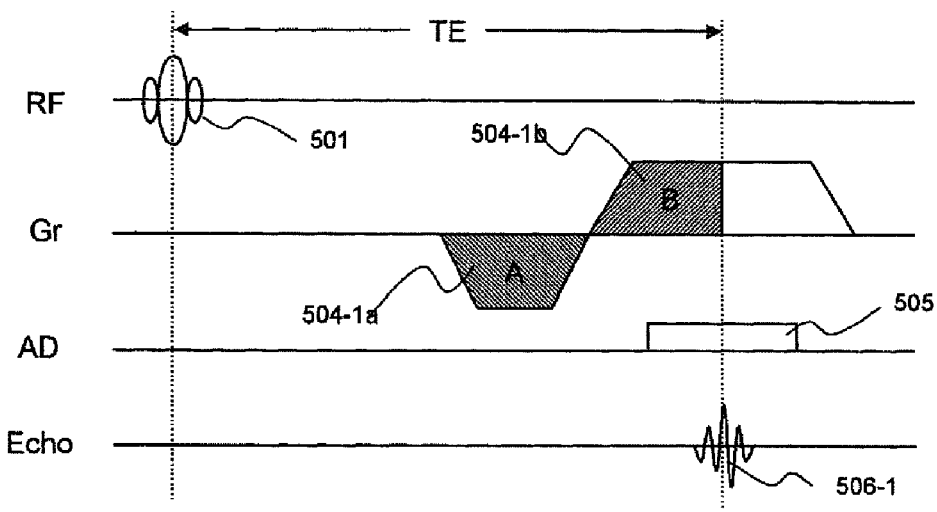
FIG. 5 is a diagram showing an example when a reading gradient magnetic field contains a gradient magnetic offset.
Figure 5:
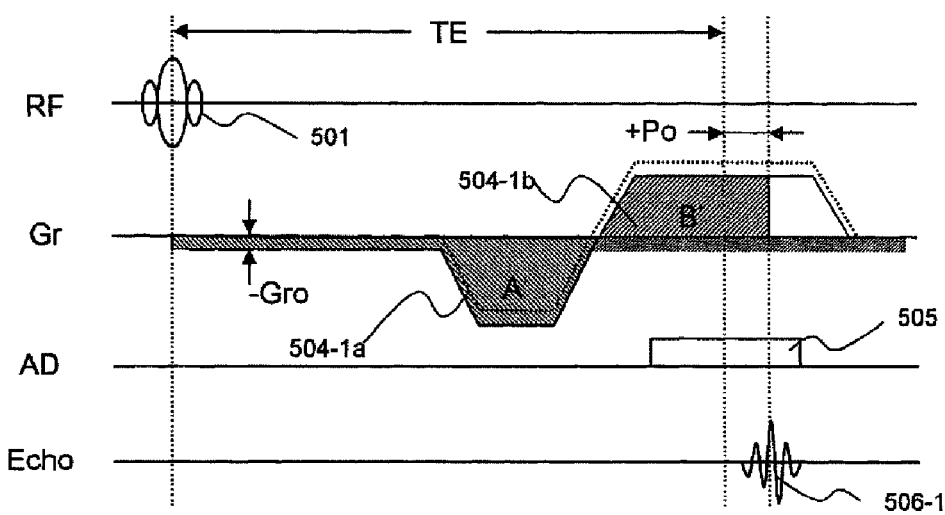

FIG. 5 shows an example when the reading gradient magnetic field Gr has a gradient magnetic field offset, and shows the extracted axes of the RF pulse, the reading gradient magnetic field Gr, the AD conversion and the echo signal of one repeat TR of the sequence shown in FIG. 2. FIG. 5(a) shows a case where there is no gradient magnetic field offset, and FIG. 5(b) shows a case where the reading gradient magnetic field Gr contains a gradient magnetic field offset Gro.

When there is no gradient magnetic field offset, as shown in FIG. 5(a), the peak of the echo signal 506-1 occurs at a time when the sum of the integration amounts of a diphase gradient magnetic field pulse 504-1a and a reading gradient magnetic field pulse 504-1b applied to the reading gradient magnetic field Gr axis is equal to zero (that is, the time when the area of an A portion and the area of a B portion are equal to each other in the case of FIG. 5(a)). The time period from irradiation of the RF pulse 501 till occurrence of an echo signal is called as TE.

On the other hand, when the reading gradient magnetic field direction contains the gradient magnetic field offset Gro, the applied amount of the reading gradient magnetic field pulses 504-1a and 504-1b added with the gradient magnetic field offset Gro corresponds to the total amount of the gradient magnetic field applied during the time period when the echo signal is achieved as shown in FIG. 5(b). Therefore, an area A' of the diphase gradient magnetic field pulse 504-1a which is applied with the same polarity as the gradient magnetic field offset Gro is apparently increased. The reading gradient magnetic field pulse 504-1b is applied with the opposite polarity to the gradient magnetic field offset, and thus an area B' thereof is apparently reduced. Accordingly, the time at which the integration amount of the gradient magnetic field pulse applied to the reading gradient magnetic field Gr axis is equal to zero is shifted in the direction of a time axis t by a predetermined time P0 as compared with the case of FIG. 5(a). That is, the peak of the echo signal 506-1 occurs after the time of (TE+P0). Accordingly, the sampled data is shifted in the Kx direction in the measurement space and located at the shifted position. Here, the shift amount is represented by $\Delta Kx$.

Figure 6:
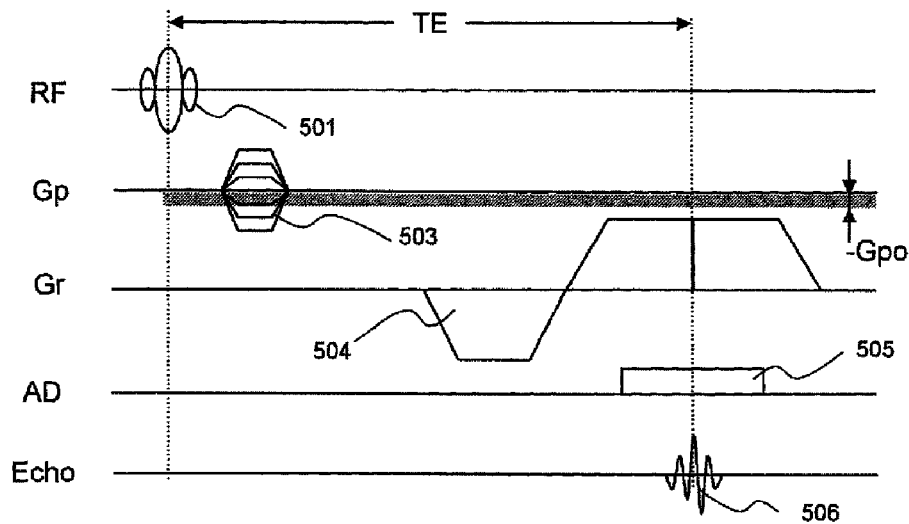
FIG. 6 is a diagram showing an example when a phase encode gradient magnetic field contains a gradient magnetic field offset.
Figure 6:
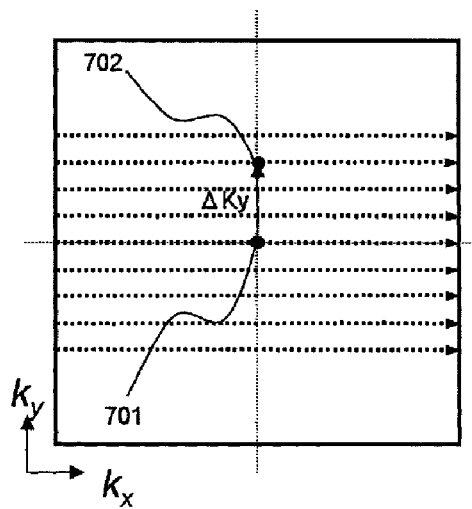
Figure 6:
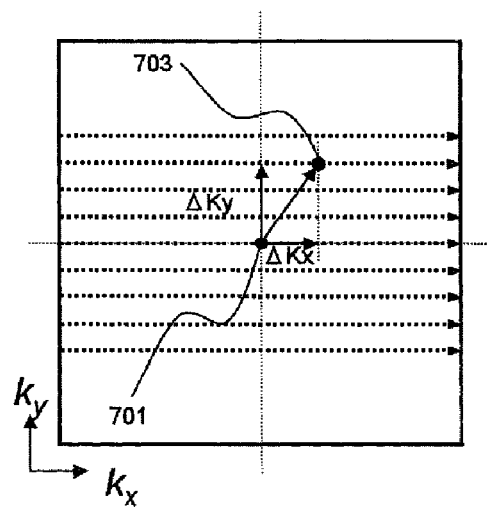

FIG. 6 is a diagram showing an example when the phase encode gradient magnetic field Gp has a gradient magnetic field offset, and it shows the extracted axes of the RF pulse, the phase encode gradient magnetic field Gp, the reading gradient magnetic field Gr, the AD conversion and the echo signal of one repeat TR of the sequence shown in FIG. 2.

FIG. 6(a) shows a case where a gradient magnetic field offset $-Gpo$ exists in the phase encode direction. The occurrence position (timing) of the echo signal 506 is dependent on the area of the reading gradient magnetic field pulse Gr 504. Therefore, even when the gradient magnetic field offset $-Gpo$ exists in the phase encode direction, the occurrence timing of the echo signal 506 is TE. However, the intensity of the actually applied phase encode pulse is different from that set in the pulse sequence due to an effect of the gradient magnetic field offset $-Gpo$ in the phase encode direction. Therefore, the sampled data are shifted in the Ky direction in the measurement space and located at the shifted position. The shift amount at this time is represented by $\Delta Ky$. As shown in FIG. 6(b), when the arrangement position of the data when there is no offset $-Gpo$ is set to a center 701 of the measurement space, the arrangement position when there is an offset $-Gpo$ is set to a position 702 which is shifted from the center 701 of the measurement space in the Ky direction by $\Delta Ky$.

FIG. 6(c) shows an aspect that sampled data when both the reading gradient magnetic field Gr and the phase encode gradient magnetic field Gp contain the gradient magnetic field offsets $-Gro$ and $-Gpo$ is arranged in the measurement space. In this case, the arrangement position when both the offsets do not exist is set to the center 701 of the measurement space. In this case, the sampled data is arranged at a position 703 which is shifted from the center 701 of the measurement space in the directions of Ky and Kx by $\Delta Ky$ and $\Delta Kx$, respectively.

As described above, when there is any gradient magnetic field offset, the peak position of the echo signal is shifted, and in connection with this shift, the sampled data is arranged at the shifted position on the measurement space. In this case, the shift of the peak position is caused by the gradient magnetic field offset. However, the same effect occurs due to deformation of the gradient magnetic field which is caused by time deviation of the rising time of the gradient magnetic field, non-uniformity of magnetostatic field, non-linearity of the gradient magnetic field or the like. However, with respect to the shift of the peak position in the phase encode direction, when the phase encode pulse is discretely applied, the time deviation of the rising time of the gradient magnetic field has little effect. These factors which cause the deformation of the gradient magnetic field are collectively called as a gradient magnetic field error.

Figure 7:
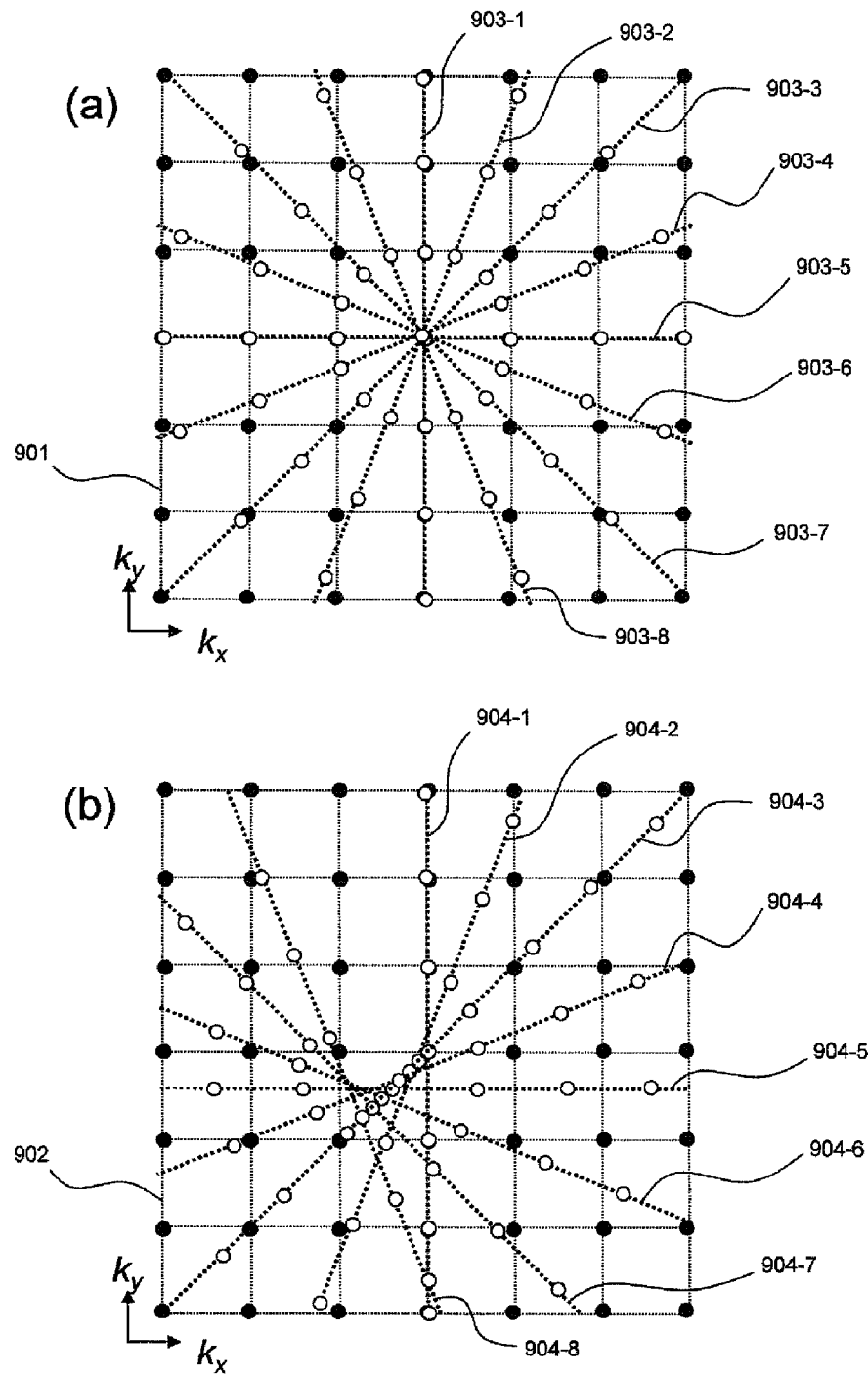
FIG. 7 is a diagram showing an effect of a gradient magnetic field error in a measurement space.

The effect of the gradient magnetic field error on the data arrangement in the measurement space has been described above by using the orthogonal system sampling method. The same effect occurs in the radial sampling method. FIG. 7 is an enlarged view showing the center portion of the measurement space. As in the case of FIG. 3(c), filled circles represent lattice points of the orthogonal system coordinate of the measurement space, and open circles represent the arrangement of data (data points) obtained by the radial sampling method. The data sampled by the radial sampling method are arranged on scan lines having gradients (rotational angles $\theta(n)$) determined by the ratio between the phase encode gradient magnetic field and the frequency encode gradient magnetic field with substantially one point of the measurement space (generally, origin) set as the center. FIG. 7(a) shows an ideal state having no gradient magnetic field error, and the data points of measured echo signals 903 are radially and regularly arranged around one point of the measurement space (the origin in FIG. 7(a)).

FIG. 7(b) shows a state that there is a gradient magnetic field error. When the peak position of the echo signal is shifted due to the gradient magnetic field error, the positions of data to be sampled are shifted, and thus the positions are not regularly radially arranged as shown in FIG. 7(b). When the pulse sequence is set, no consideration is paid to the gradient magnetic field error, and thus the gridding processing in the reconstruction based on this pulse sequence is executed on the assumption that the positions of the data are arranged under an ideal state as shown in FIG. 7(a). Accordingly, the transformation is not accurately executed and the image quality is deteriorated because of disappearance of image signals, etc., so that an artifact occurs. Furthermore, the gradient magnetic field error contains an element which is varied in accordance with the application axis of the reading gradient magnetic field pulse. Therefore, in the radial sampling method, the effect of the gradient magnetic field error may be varied in accordance with the rotational angle of a scan line on which sampled data are arranged.

According to this embodiment, with respect to the shift of the sampled data in the measurement space which occurs as described above in the radial sampling method, the shift amount of each data is calculated and corrected by using predetermined data (signal correcting data). The procedure of obtaining the signal correcting data and the correction processing using the procedure according to this embodiment will be described hereunder.

First, the acquisition of the signal correcting data will be described. As described above, the effect of the gradient magnetic field error appears as a shift in the Kx-axis direction and the Ky-axis direction of the measurement space in the orthogonal system sampling method. In this embodiment, in order to obtain the signal correcting data, the same sequence as the orthogonal system sampling method is partially executed in the pulse sequence of the radial sampling method. Specifically, with respect to a specific echo signal, plural echo signals are obtained in parallel to the echo signal concerned. These echo signals can be obtained by applying a phase encode gradient magnetic field pulse with the same reading gradient magnetic field pulse intensity as an echo signal acting as a benchmark in plural parallel echo signals and in a direction perpendicular to the reading gradient magnetic field pulse within the imaging slice plane (corresponding to the rotation of the measurement space by oblique imaging).

Figure 8:
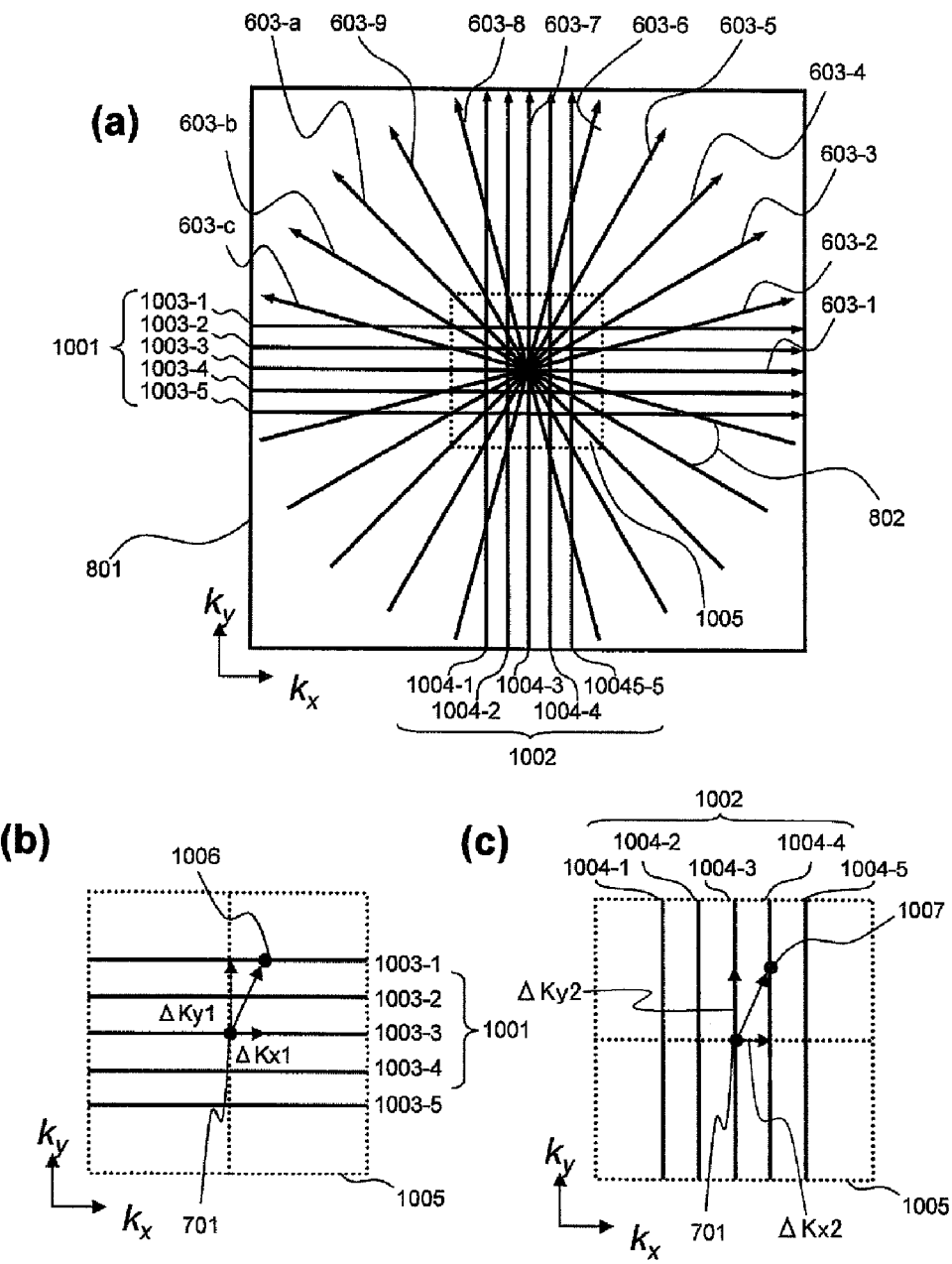
FIG. 8 is a schematic diagram showing the measurement space in which echo signals obtained from the pulse sequence in the first embodiment are arranged.

FIG. 8(a) is a schematic diagram showing the measurement space in which the echo signals obtained through the pulse sequence of this embodiment are arranged. As shown in FIG. 8(a), the echo signals sampled by using the pulse sequence of this embodiment contain blocks 1001 and 1002 in which plural echo signals are arranged in parallel to specific echo signals 603-1 and 603-7. Echo signal groups 1003-1 to 1003-5 and 1004-1 to 1004-5 which are parallel to each other in the measurement space are arranged in the blocks 1001 and 1002. In this embodiment, as shown in FIG. 8(a), the block 1001 comprising the echo signal group parallel in the Kx-axis direction and the block 1002 comprising the echo signal group parallel in the Ky-axis direction are obtained. This is because an x component and a y component are extracted with respect to each of the effect of the gradient magnetic field error in the phase encode direction and the effect of the gradient magnetic field error in the direction perpendicular to the phase encode direction. The two blocks to be obtained are not limited to the above blocks insofar as the angles thereof are different from each other. The number of blocks to be obtained may be two or more, and it is not limited to 2.

Subsequently, the data shift amount caused by the gradient magnetic field error, that is, the shift amount of the peak position of the echo signal is calculated by using the data in the blocks. With respect to the data shift amount, components ΔKy1 and ΔKx2 in the phase encode direction and components ΔKx1 and ΔKy2 in the direction (frequency encode direction) perpendicular to the phase encode direction are calculated for each block.

FIGS. 8(b) and 8(c) are diagrams showing the data shift due to the gradient magnetic field error, and show the data of the blocks 1001 and 1002 respectively while a center portion 1005 of the measurement space is enlarged. In this case, it is assumed that the data to be arranged at the center 701 of the measurement space are shifted to positions 1006 and 1007 due to the gradient magnetic field error.

With respect to the data shift amount (the shift of the peak position) at any angle (θ), component ΔP(θ) thereof in the direction parallel to θ and component ΔO(θ) thereof in the direction perpendicular to θ are calculated by using the shift amounts ΔKx1, ΔKy1, ΔKx2, ΔKy2 of the respective blocks 1001 and 1002. In this embodiment, the gradient magnetic field offset amount and the gradient magnetic field error amount at any angle (θ) are first calculated, and the ΔP(θ) and the ΔO(θ) are calculated by using the gradient magnetic field offset amount and the gradient magnetic field error amount thus calculated.

Here, with respect to the gradient magnetic field error, the shift in the phase encode direction hardly contains the effect of the time deviation in the rising time of the gradient magnetic field pulse. Therefore, it is considered that this shift is caused by the gradient magnetic field offset. Accordingly, a part of the gradient magnetic field error in the X-axis and Y-axis directions in the imaging section, which is caused by the gradient magnetic field offset, can be calculated from the shift in the phase encode direction. The gradient magnetic field error obtained from the shift in the phase encode direction will be hereunder referred to as "gradient magnetic field offset amount".

On the other hand, the shift in the frequency encode direction contains not only the effect of the offset of the gradient magnetic field, but also the effects of the non-linearity of the gradient magnetic field and the time deviation of the rising time. Accordingly, according to this embodiment, the gradient magnetic field offset amount is first calculated by using the shift amount in the phase encode direction, and then the gradient magnetic field offset amount is subtracted from the gradient magnetic field error obtained from the shift amount in the frequency encode direction to calculate the gradient magnetic field error other than the gradient magnetic field offset amount.

First, by using the shift amount ΔKy(ΔKy1, ΔKx2) in the phase encode direction measured in each block, a gradient magnetic field offset amount $G_{off}$ in the X-axis and Y-axis directions in the imaging section is calculated according to the following expression on the basis of the applied amount Gp of the phase encode gradient magnetic field pulse corresponding to one encode step of the measurement space which is used when the signal is obtained.

$$G_{off} = \Delta Ky/(\gamma \cdot FOV \cdot TE) \qquad \text{(expression 5)}$$

Here, γ represents a magnetogyric ratio, FOV represents an imaging visual-field size and TE represents an echo time set in the sequence. An X-axis direction component $G_{offX}$ of the $G_{off}$ and a Y-axis direction component $G_{offY}$ of the $G_{off}$ are calculated by using ΔKy1 and ΔKx2 respectively by the following expressions.

$$G_{offX}=\Delta Kx2/(\gamma \cdot FOV \cdot TE) \quad \text{(expression 6)}$$

$$G_{offY}=\Delta Ky1/(\gamma \cdot FOV \cdot TE) \quad \text{(expression 7)}$$

By using the X-axis direction component $G_{offX}$ and the Y-axis direction component $G_{offY}$ of the gradient magnetic field offset amount, gradient magnetic field offset amounts $R_{offX}(\theta)$ and $R_{offY}(\theta)$ at any angle (θ) in the measurement space are calculated by the following expressions.

$$R_{offX}(\theta)=G_{offX}\times\cos(\theta)-\sin(\theta) \quad \text{(expression 8)}$$

$$R_{offY}(\theta)=G_{offY}\times\cos(\theta)-\sin(\theta) \quad \text{(expression 9)}$$

Subsequently, by using the shift amount ΔKx(ΔKx1, ΔKy2) in the frequency encode direction, the gradient magnetic field error other than the gradient magnetic field offset amount $G_{off}$ is calculated. First, peak shift amount in the frequency encode direction which is caused by the gradient magnetic field offset amount $G_{off}$ is represented as follows.

$$\Delta K=G_{off}\times\gamma\times FOV\times TE/\text{Sample} \quad \text{(expression 10)}$$

Here, Sample represents the number of sampling points in the frequency encode direction. This value is subtracted from the shift amount ΔKx of the peak position in the frequency encode direction, and gradient magnetic field error $G_{error}$ is calculated by the following expression.

$$G_{error}=(\Delta Kx-\Delta K)\cdot\text{Sample}/(\gamma\cdot FOV) \quad \text{(expression 11)}$$

By substituting the expression 10 into the expression 11, $$G_{error}=\Delta Kx\times\text{Sample}/(\gamma\cdot FOV)-G_{off}\times TE \quad \text{(expression 12)}$$

An X-axis direction component $G_{errorX}$ and a Y-axis direction component $G_{errorY}$ of $G_{error}$ are calculated by using ΔKx1, ΔKy2 and $G_{offX}$, $G_{offY}$ as follows.

$$G_{errorX}=\Delta Kx1\cdot\text{Sample}/(\gamma\cdot FOV)-G_{offX}\times TE \quad \text{(expression 13)}$$

$$G_{errorY}=\Delta Ky2\cdot\text{Sample}/(\gamma\cdot FOV)-G_{offX}\times TE \quad \text{(expression 14)}$$

By using the gradient magnetic field error amounts $G_{errorX}$ and $G_{errorY}$ in the X-axis and Y-axis directions in the imaging section, gradient magnetic field error amounts $R_{errorX}(\theta)$ and $R_{errorY}(\theta)$ at any angle (θ) in the measurement space are calculated as follows.

$$R_{errorX}(\theta)=G_{errorX}\times\cos(\theta)-G_{errorY}\times\sin(\theta) \quad \text{(expression 15)}$$

$$R_{errorY}(\theta)=G_{errorY}\times\cos(\theta)+G_{errorX}\times\sin(\theta) \quad \text{(expression 16)}$$

The displacement of the measurement space at any angle (θ) is calculated by using the thus-calculated gradient magnetic field offset amount and gradient magnetic field error amount at any angle (θ) in the measurement space. In this case, ΔP (θ) and ΔO(θ) are calculated by the following expressions 17 and 18.

$$\Delta P(\theta)=(R_{errorX}(\theta)+R_{offX}(\theta)\cdot TE)\times\gamma\cdot FOV/\text{Sample} \quad \text{(expression 17)}$$

$$\Delta O(\theta)=R_{offY}(\theta)\times\gamma\cdot FOV\cdot TE \quad \text{(expression 18)}$$

In this embodiment, with respect to the thus-calculated data shift amount at any angle θ in the measurement space, by using the displacement amount ΔP(θ) of the peak position in the direction parallel to θ and the displacement amount ΔO(θ) of the peak position in the direction perpendicular to θ, each data is shifted so that the peak position thereof is coincident with the origin of the measurement space.

In place of the shift of the peak position of the echo signal in the measurement space in accordance with the thus-calculated shift amount, the echo signal may be subjected to phase correction in a one-dimensionally Fourier-transformed space. In this case, the relation between the peak position of the measurement space and a phase φ in the space obtained by subjecting the echo signals to one-dimensional Fourier transform is represented by the following expression 19 when the calculated displacement amount of the peak position is represented by ΔK.

$$\phi(x)=\Delta K\times 2\pi\times x/X \quad \text{(expression 19)}$$

(X represents the number of data points in the image space under the reconstruction: $1\leq x\leq X$). With respect to the phase correction, when complex data as correction target is represented by C(n, x) and the phase of the signal correcting data is represented by φ(n,x), the data C'(n,x) after the correction is represented by the following expressions 20 and 21.

$$Re[C'(n,x)]=Re[C(n,x)]\times\cos(\phi(n,x))-Im[C(n,x)]\times\sin(\phi(n,x)) \quad \text{(expression 20)}$$

$$Im[C'(n,x)]=Im[C(n,x)]\times\cos(\phi(n,x))+Re[C(n,x)]\times\sin(\phi(n,x)) \quad \text{(expression 21)}$$

Here, Re[ ] and Im[ ] represent the rear and imaginary parts of the data, respectively. The merit of the phase correction resides in that the correction can be performed on a sub-pixel basis and thus the correction precision is high.

Figure 9:
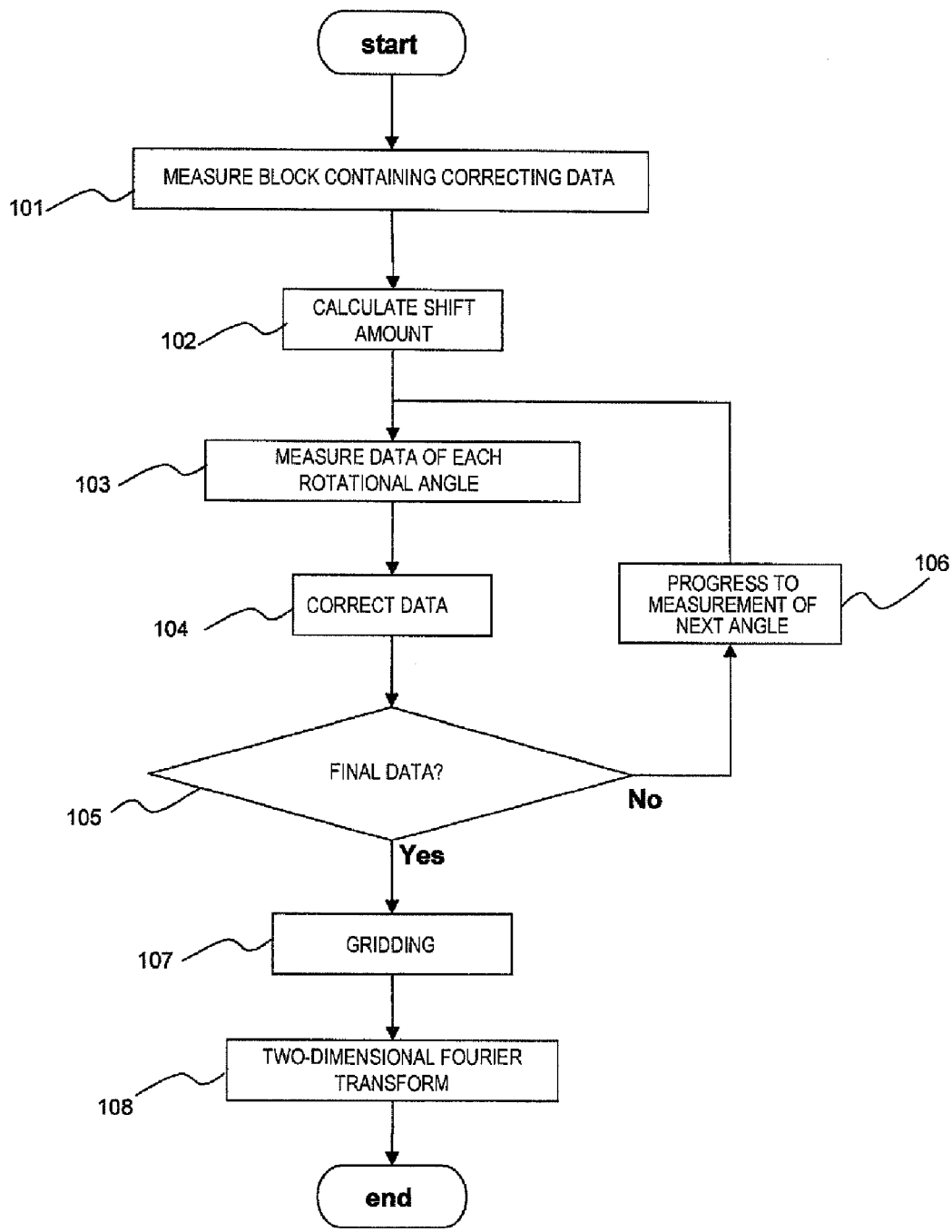
FIG. 9 is a flowchart of correction processing according to the first embodiment.

Next, the procedure of the correction processing according to this embodiment will be described. FIG. 9 is a flowchart showing the correction processing of the gradient magnetic field error in the radial sampling method according to this embodiment. The following processing is executed by the CPU 8 according to a program which is held in a memory or the like in advance.

First, the measurement of signal correcting data is executed (step 101). In this case, the measurement of the two blocks described above is executed. However, in this embodiment, the data measured in this measurement are also used for image reconstruction.

The gradient magnetic field offset amount and the gradient magnetic field error amount for each rotational angle θ are calculated from the shift amount ΔKy in the phase encode direction measured in each block by using the data obtained in step 101. The displacement amount of the peak position in the direction parallel to the rotational angle θ and the displacement amount of the peak position in the direction perpendicular to θ are calculated by using the gradient magnetic field offset amount and the gradient magnetic field error amount (step 102).

The rotational angle θ(n) is varied, and echo signals are measured (step 103).

The respective data obtained by sampling the echo signals obtained in step 103 are corrected by using the displacement amount calculated in step 102 (step 104).

It is determined whether the measurement of all the rotational angles θ(n) required for the image reconstruction is finished or not (step 105). In this case, when n is equal to the maximum value (in this case, 12), it is determined that the measurement of all the rotational angles θ(n) is finished. When it is determined that the whole measurement is finished, that is, when it is determined that the data processed in step 104 is the final data, the processing shifts to the next step 107. On the other hand, when the data concerned is not the final data, n is incremented by 1 (step 106), and the processing returns to step 103 to measure the next rotational angle θ(n).

All the data after the correction are subjected to gridding to determine data on the respective lattice points of the measurement space (step 107). At this time, in this embodiment, all the data of the block containing the signal correcting data can be also used for gridding. Accordingly, an image can be created without wasting the obtained data.

The measurement space data which are subjected to gridding in step 107 are subjected to two-dimensional Fourier transform to obtain an image (step 108).

In the above processing flow, the shift amount is calculated from the signal correcting data, and then the rotational angle is varied to measure the respective data. However, the shift amount may be calculated from the signal correcting data to correct the respective data after all the data are first measured.

As described above, the data used to calculate the shift amount of the peak position of the echo signal are obtained in the process of obtaining the data used to reconstruct an image. Accordingly, a specific sequence is not required to be executed to obtain the signal correcting data. Therefore, according to this embodiment, even when the peak position of the echo signal is shifted due to the non-uniformity of the magnetostatic field, the non-linearity of the gradient magnetic field, the gradient magnetic field offset or the like, the shift of the peak position of the echo signal can be corrected with minimizing the extension of the imaging time. Accordingly, the disappearance of the image signal and the artifact can be reduced with suppressing the extension of the imaging time, and the image quality can be enhanced.

In this embodiment, the imaging condition for measuring the shift amount can be set on the basis of the imaging parameters which are set in the measurement for obtaining an image. For example, in this embodiment, plural echo signals added with phase encodes are obtained in the measurement of a block containing signal correcting data. The number of the echo signals to be obtained in the block and the interval between respective echo signals in the measurement space are set on the basis of the imaging parameters as follows.

In the radial sampling method, when the echo signal is displaced in the measurement space by one pixel or more in the gridding process, the artifact is increased. Therefore, the pitch for calculating the gradient magnetic field offset is required to be determined on the basis of the pitch of the measurement space which is set on the basis of the imaging condition. A gradient magnetic field intensity $G_{step}$ corresponding to one line in the phase encode direction is represented by using the imaging visual field (FOV) and the magnetogyric ratio γ according to the following expression 22.

$$G_{step} = 1/(\gamma \cdot FOV) \quad \text{(expression 22)}$$

In this embodiment, the interval on the measurement space in the phase encode direction can be determined according to the expression 22.

Figure 10:
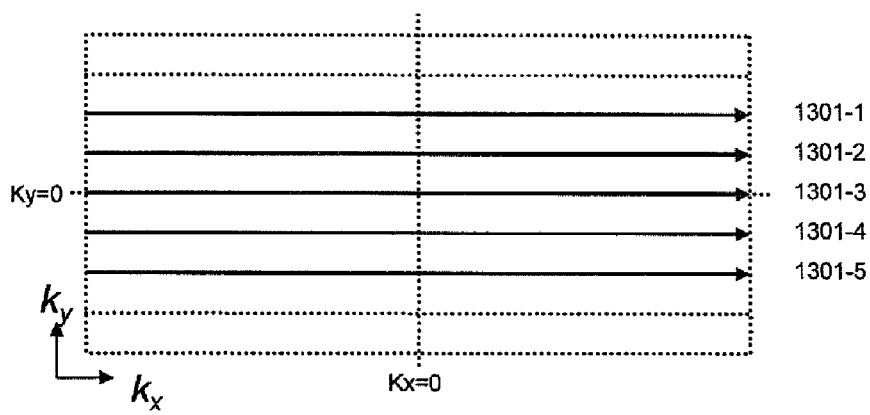
FIG. 10 shows a setting example of a data obtaining sequence for correction according to the first embodiment.
Figure 10:
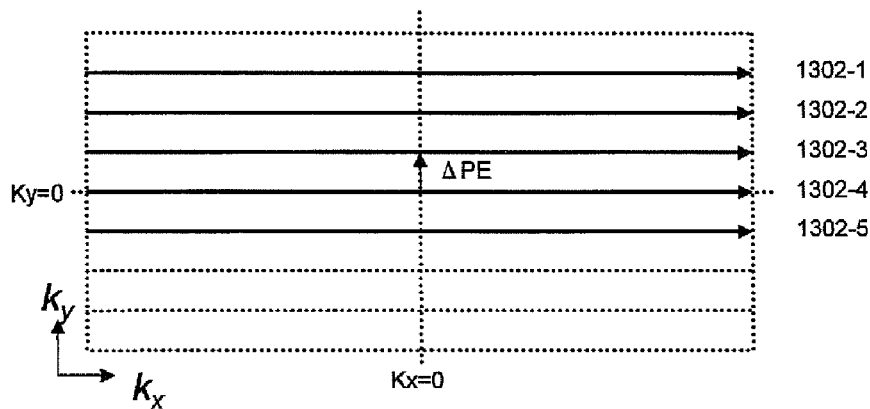
Figure 10:
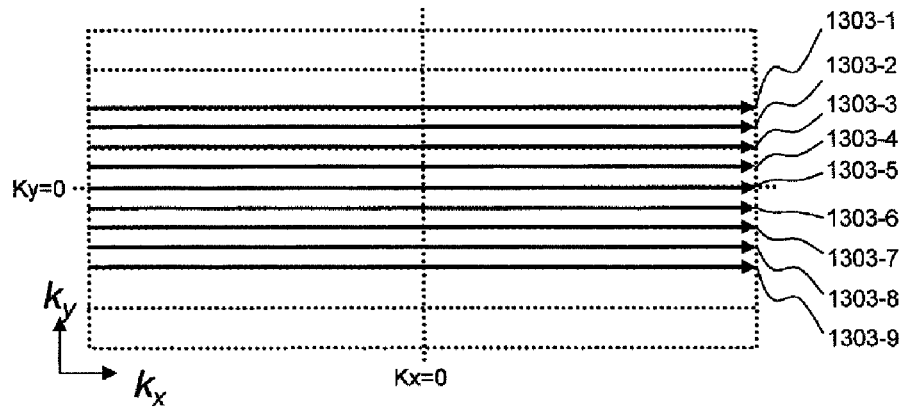

FIG. 10 shows a setting example of the data obtaining sequence for correction. In FIG. 10, the description will be described by applying to cases where the phase encode is applied in the Ky direction to obtain plural echo signals. In this case, only the neighborhood of the center (Kx=0, Ky=0) of the measurement space is shown. The positions corresponding to the phase encode step based on the gradient magnetic field intensity $G_{step}$ calculated according to the expression 22 are indicated by dashed lines.

FIG. 10(*a*) shows a setting example so that five data 1301-1 to 1301-5 are obtained in the phase encode step based on the gradient magnetic field intensity $G_{step}$ calculated according to the expression 22. The measurement of the block containing the correction data is a measurement for extracting the shift of the peak position of the echo signal. In order to check whether the peak position of the echo signal falls within the phase encode step, the number of echo signals to be measured is set to two or more with Ky=0 set at the center.

The peak position of the echo signal varies dependently of the gradient magnetic field offset amount. Therefore, a shift ΔPE is set on the basis of the polarity of the gradient magnetic field offset amount, so that many correcting data can be obtained in the shift direction of the peak position of the echo signal. FIG. 10(*b*) shows a case where the setting of the phase encode is shifted to the upper side by only ΔPE as compared with FIG. 10(*a*) and five data 1302-1 to 1302-5 are obtained in the phase encode step based on the gradient magnetic field intensity $G_{step}$ calculated according to the expression 22. According to the above construction, the correction value can be calculated with higher precision by even a small number of echo signals.

In the imaging operation using the MRI apparatus, various kinds of measurements are normally executed as a pre-scan to adjust the apparatus before imaging for diagnosis is executed. At this time, the gradient magnetic field offset is also frequently adjusted. The shift ΔPE is determined on the basis of the polarity of the gradient magnetic field offset amount obtained through the above pre-scan. A part of the gradient magnetic field offset which is caused by the gradient magnetic field power source is not dependent on the examinee, and it is fixed at all times. However, another part of the gradient magnetic field offset is caused by disturbance of magnetic field occurring when the examinee enters the imaging area. Accordingly, when the rate of the part of the gradient magnetic field offset, which is dependent on the examinee, is equal to a predetermined value or more, the gradient magnetic field offset is calculated every time the imaging section is set.

In general, the step of the phase encode gradient magnetic field may be set at the interval determined by the above expression 22. However, when the precision is further enhanced, the above interval may be further narrowed. FIG. 10(*c*) shows a case where the step of the phase encode gradient magnetic field is set so that the step concerned is equal to a half step of FIG. 10(*a*), and nine data 1303-1 to 1303-9 are obtained. In this case, the interval of the phase encode step decreases by half, so that the calculation precision of the displacement of the echo peak in the Ky direction is doubled as compared with the case of FIG. 10(*a*). Furthermore, the methods of FIG. 10(*b*) and FIG. 10(*c*) may be combined.

As described above, according to this embodiment, the imaging condition for measuring the gradient magnetic field offset amount and the gradient magnetic field error amount can be set on the basis of the imaging parameters set in the measurement for obtaining an image, and thus the correcting data can be obtained efficiently.

Figure 11:
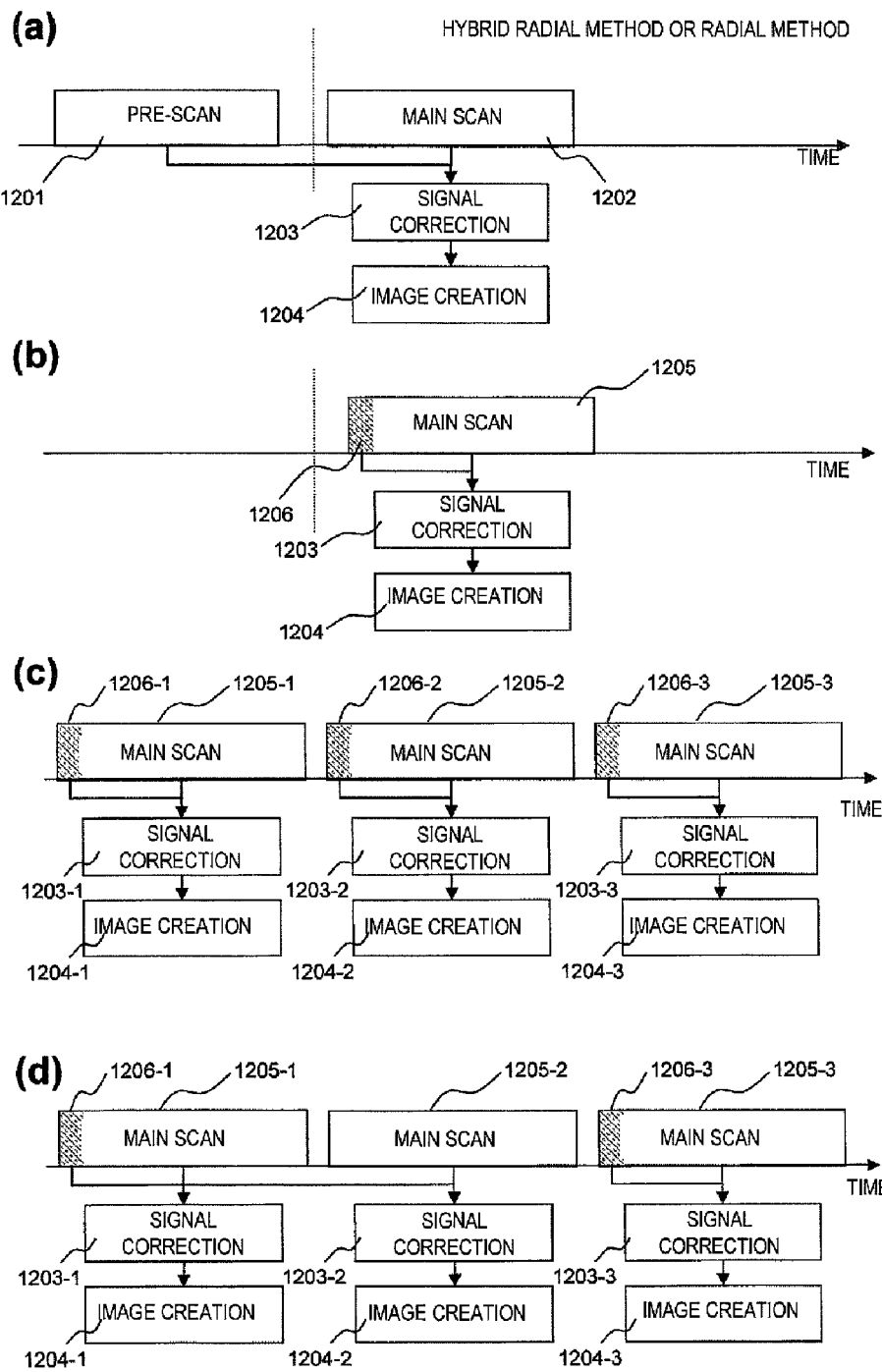
FIG. 11 is a diagram showing enhancement of a measurement efficiency according to the first embodiment.

Next, the effect on time according to the present invention will be described. FIG. 11 is a diagram showing enhancement of the efficiency of the measurement according to this embodiment.

FIG. 11(*a*) shows a typical conventional imaging example, and shows a case where signal correcting data are obtained by a pre-scan 1201. A main scan 1202 is based on the hybrid radial method or the radial method. In this case, the data obtained in the main scan 1202 are corrected on the basis of the correcting data obtained in the pre-scan 1201 in a signal correcting step 1203, and an image is reconstructed in an image creating step 1204. At this time, the signal correcting data obtained in the 1201 are not used for image creation.

On the other hand, according to this embodiment, as shown in FIG. 11(*b*), a block containing signal correcting data 1206 is measured during a main scan 1205, and thus the pre-scan 1201 shown in the conventional example is unnecessary. The data obtained in the main scan 1205 are subjected to signal correction in the signal correcting step 1203 and then reconstructed to an image in the image creating step 1204.

FIG. 11(c) shows an example when this embodiment is applied to dynamic imaging or fluoroscopic imaging. FIG. 11(c) shows a case where the measurement is executed at three times. In this embodiment, the signal correcting data 1206 are obtained during each of respective main scans 1205-1 to 1205-3 which are continuously executed. The respective data obtained in the main scan 1205 are subjected to signal correction in the signal correcting steps 1203-1 to 1203-3, and then reconstructed to images in the image creating steps 1204-1 to 1204-3. This example is applied to a case where tomograms of different imaging sections are continuously picked up, etc. When the imaging section is changed, the rate of the gradient magnetic field output varies. Therefore, the signal correcting data 1206 is required to be obtained in each case.

FIG. 11(d) shows another example when this embodiment is applied to the dynamic imaging or the fluoroscopic imaging. In this case, the signal correcting data 1206 are not obtained in the second main scan 1205-2 unlike FIG. 11(c). In this case, the data obtained in the second main scan 1205-2 are subjected to signal correction by using the signal correcting data 1206-1 obtained in the first main scan 1205-1 through the signal correcting step 1203-2, and then reconstructed to an image in the image creating step 1204-2. For example, when the imaging section is not changed during continuous imaging, the rate of the gradient magnetic field output is unvaried, and thus the correcting data can be shared. This example is applied to such a case. By executing the sequence as described above, the time for obtaining the correcting data can be reduced, and thus the frame rate of the image can be enhanced.

<<Second Embodiment>>

Next, a second embodiment according to the present invention will be described. In the first embodiment, the shift amount of each data is calculated from the data of two blocks measured by applying a phase encode, and the correction is executed by using the calculated shift amount. However, in this embodiment, the gradient magnetic field offset amount and the gradient magnetic field error amount are calculated from the data of the two blocks, and a pulse sequence is reconfigured (reset) by using them to execute a subsequent measurement. Here, the reconfiguration of the pulse sequence means that the phase encode gradient magnetic field Gp and the frequency encode gradient magnetic field Gr from which the effect of the error is excluded are calculated to configure (set) a pulse sequence using them. The MRI apparatus of this embodiment is basically the same as the first embodiment. This embodiment will be described while concentrating on the construction different from the first embodiment.

In this embodiment, the block 1001 comprising an echo signal group parallel to the Kx-axis direction and the block 1002 comprising an echo signal group parallel to the Ky-axis direction are also measured as signal correcting data as shown in FIGS. 8(b), (c). The components in the phase encode direction of data shift amounts caused by gradient magnetic field errors, that is, shift amounts of the peak position of the echo signal, which are obtained from data in the respective blocks are represented by ΔKy1 and ΔKx2 respectively, and the components in the direction (frequency encode direction) perpendicular to the phase encode direction of the data shift amounts concerned are represented by ΔKx1 and ΔKy2, respectively. In this embodiment, the two blocks to be obtained are not limited to specific ones insofar as they have different angles. Furthermore, the number of blocks to be obtained is not limited to two insofar as it is equal to two or more.

In this embodiment, the gradient magnetic field from which the effect of the error is excluded, a gradient magnetic field G'p (θ(n)) of the phase encode axis and a gradient magnetic field G'r(θ(n)) of the frequency encode axis are calculated by using the gradient magnetic field offset amounts $R_{offX}(\theta)$ and $R_{offY}(\theta)$ and the other gradient magnetic field errors $R_{errorX}(\theta)$ and $R_{errorY}(\theta)$ of the respective axis directions at any angle θ in the measurement space which are obtained according to the expressions 8, 9, 15 and 16 in the first embodiment. In this case, each of $R_{offX}(\theta)$, $R_{offY}(\theta)$, $R_{errorX}(\theta)$ and $R_{errorY}(\theta)$ is subtracted from the gradient magnetic field amount Gp(θ(n)), Gr(θ(n)) at the execution time of the sequence which are calculated according to the expressions 3 and 4 of the first embodiment to calculate the values G'p(θ(n)), G'r(θ(n)) from which the effect of the error is excluded. That is, the following calculation is executed.

$$G'p(\theta(n))=Gp(\theta(n))-R_{errorY}(\theta(n))-R_{offY}(\theta(n))\cdot TE \quad \text{(expression 23)}$$

$$G'r(\theta(n))=Gr(\theta(n))-R_{errorX}(\theta(n))-R_{offX}(\theta(n))\cdot TE \quad \text{(expression 24)}$$

The calculation is executed by using the respective gradient magnetic fields G'p(θ(n)), G'r(θ(n)) after the correction while rotational angle (θ) is changed.

In the case of the hybrid type radial sampling method in which the sequence uses the phase encode pulse together, the gradient magnetic field offset amounts $R_{offX}(\theta)$ and $R_{offY}(\theta)$ may be contained in the phase encode part. At this time, when phase encode gradient magnetic field pulses of the phase encode axis and the frequency encode axis at each rotational angle are represented by Gpp(θ(n)), Gpr(θ(n)), values Gp'p(θ(n)), Gp'r(θ(n)) from which the effect of the error is excluded are represented as follows.

$$Gp'p(\theta(n))=Gpp(\theta(n))-R_{offY}(\theta(n))\cdot TE \quad \text{(expression 25)}$$

$$Gp'r(\theta(n))=Gpr(\theta(n))-R_{offX}(\theta(n))\cdot TE \quad \text{(expression 26)}$$

In this case, when frequency encode gradient magnetic field pulses of the phase encode axis and the frequency encode axis at each rotational angle are represented by Grp(θ(n)), Grr(θ(n)), values Gr'p(θ(n)), Gr'r(θ(n)) from which the effect of the error is excluded are represented as follows.

$$Gr'p(\theta(n))=Grp(\theta(n))-R_{errorY}(\theta(n)) \quad \text{(expression 27)}$$

$$Gr'r(\theta(n))=Grr(\theta(n))-R_{errorX}(\theta(n)) \quad \text{(expression 28)}$$

Figure 12:
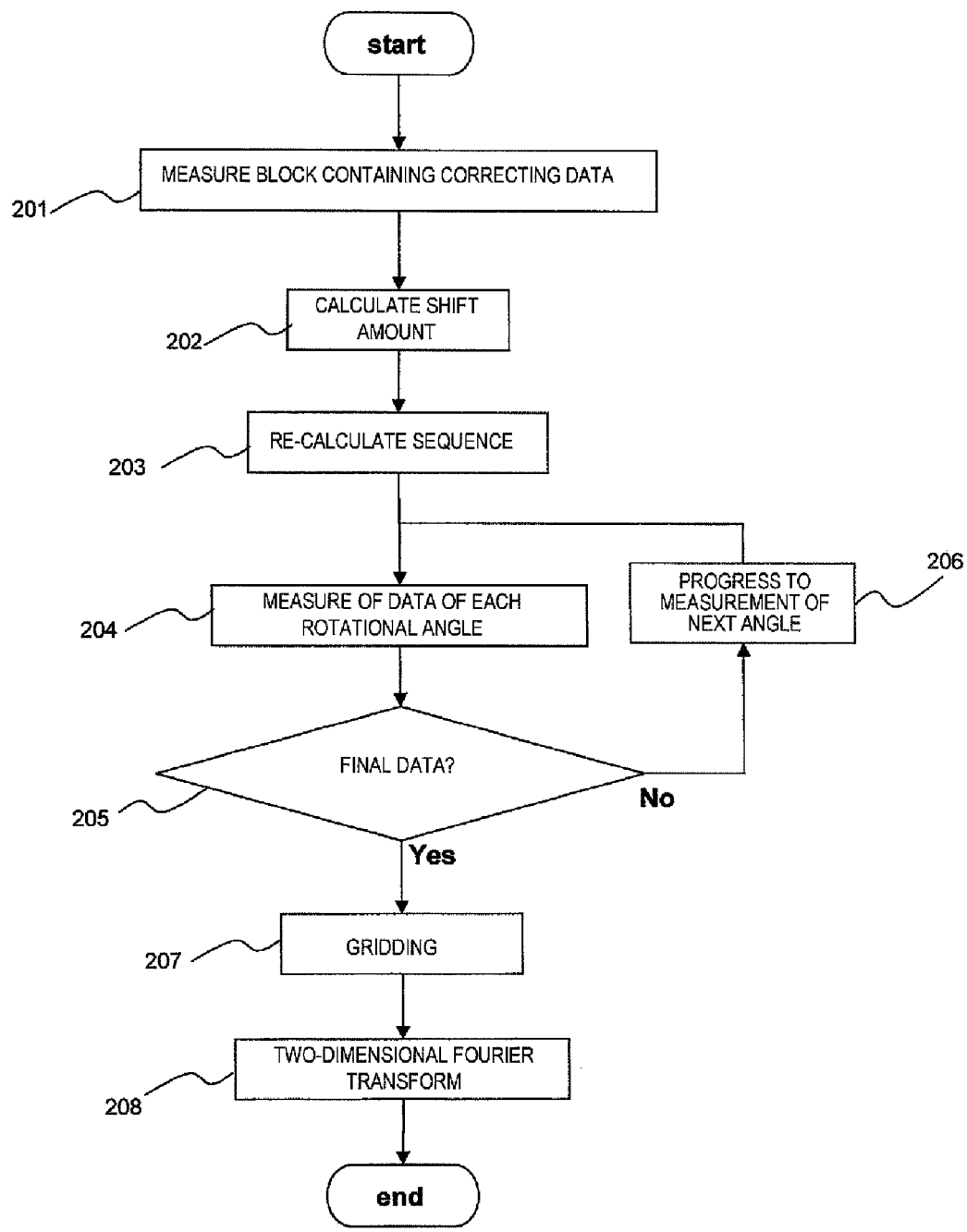
FIG. 12 is a flowchart showing correction processing according to a second embodiment.

The procedure of the correction processing according to this embodiment will be described hereunder. FIG. 12 is a flowchart showing the correction processing of this embodiment. The difference from the first embodiment resides in that a step of reconfiguring (resetting) the sequence is provided in place of the signal correction processing step.

First, the measurement of a block containing signal correcting data is executed (step 201). The gradient magnetic field offset amounts $R_{offX}(\theta)$ $R_{offY}(\theta)$ and the gradient magnetic field error amounts $R_{errorX}(\theta)$, $R_{errorY}(\theta)$ of the respective axes are calculated by using the data obtained in step 201 according to the expressions 8, 9, 15 and 16 (step 202). According to the expressions 23 and 24, the values G'p(θ(n)), G'r(θ(n)) from which the effect of the error is excluded are calculated (step 203). In the case of the hybrid type radial sampling, according to the expressions 25 to 28, the values Gp'p(θ(n)), Gp'r(θ(n)), Gr'p(θ(n)), Gr'r(θ(n)) from which the effect of the error is excluded are calculated.

Subsequently, basically as in the case of the first embodiment, the rotational angle θ(n) is changed, all echo signals required for image reconstruction are measured (steps 204 to 206), gridding is executed (step 207) and two-dimensional Fourier transform is executed (step 208) to obtain a reconstructed image.

As described above, according to this embodiment, the error is calculated from the measured signals, the sequence is executed on the basis of the gradient magnetic field amount from which the effect of the error concerned is excluded, and the gridding processing and the image reconstruction are performed by using the obtained data. Therefore, an image having no artifact can be obtained without executing the correction processing when the image is reconstructed. Accordingly, according to this embodiment, in addition to the effect of the first embodiment, correction is unnecessary in the reconstructing operation and an image can be created at high speed because echo signals are obtained in the signal measurement while reflecting the correction value.

According to this embodiment, as in the case of the first embodiment, the imaging condition for measuring the gradient magnetic field offset amount and the gradient magnetic field error amount can be set on the basis of the imaging parameters set in the measurement for obtaining an image. Furthermore, the effect on the time according to this embodiment is identical to that of the first embodiment.

<<Third Embodiment>>

Next, a third embodiment according to the present invention will be described. In this embodiment, the coordinate point as a transform destination used for the interpolation processing in the gridding operation is changed in place of the correction of the data itself or the gradient magnetic field output by using the shift amount of the signal correcting data. The MRI apparatus of this embodiment is basically the same as the first embodiment. This embodiment will be described hereunder by concentrating on the different construction from the first embodiment.

The gradient magnetic field intensities Gr, Gp, the rotational angle θ on the measurement space and the coordinate (Kx, Ky) after gridding have the following relationship.

$$Kx(\theta(n),m) = \gamma \cdot Gr(\theta(n)) \cdot \Delta t \cdot m \quad \text{(expression 29)}$$

$$Ky(\theta(n),m) = \gamma \cdot Gp(\theta(n)) \cdot \Delta t \cdot m \quad \text{(expression 30)}$$

Here, $\Delta t$ represents a data sampling pitch, and m represents a sample point.

Here, the gradient magnetic field amounts (gradient magnetic field intensities) G'r(θ(n)), G'p(θ(n)) from which the gradient magnetic field offset and the gradient magnetic field error are excluded are obtained from the expressions 23 and 24 of the second embodiment. By substituting these expressions into Gr(θ(n)), Gp(θ(n)) of the expressions 29 and 30, a gridding coordinate (K'x,K'y) is determined as follows.

$$K'x(\theta(n),m) = \gamma \cdot (Gr(\theta(n)) - R_{errorX}(\theta(n)) - R_{offX}(\theta(n))) \cdot \Delta t \cdot m \quad \text{(expression 31)}$$

$$K'y(\theta(n),m) = \gamma \cdot (Gp(\theta(n)) - R_{errorY}(\theta(n)) - R_{offY}(\theta(n))) \cdot \Delta t \cdot m \quad \text{(expression 32)}$$

In the case of the hybrid type radial sampling, when (G'r'r(θ(n))+G'p'r(θ(n))), (G'r'p(θ(n))+G'p'p(θ(n))) obtained from the expressions 25 to 28 of the second embodiment are substituted into Gr(θ(n)), Gp(θ(n)) of the expressions 29 and 30, respectively, the following expressions are obtained.

$$K'x(\theta(n),m) = \gamma \cdot (Grr(\theta(n)) - R_{errorX}(\theta(n))) \cdot \Delta t \cdot m + \gamma \cdot (Gpr(\theta(n)) - R_{offX}(\theta(n))) \cdot \Delta \tau \quad \text{(expression 33)}$$

$$K'y(\theta(n),m) = \gamma \cdot (Grp(\theta(n)) - R_{errorY}(\theta(n))) \Delta t \cdot m + \gamma \cdot (Gpp(\theta(n)) - R_{offY}(\theta(n))) \cdot \Delta \tau \quad \text{(expression 34)}$$

Here, $\Delta \tau$ represents an applied time of the phase encode gradient magnetic field pulse.

As described previously, when the gradient magnetic field error containing the gradient magnetic field offset exists at the execution time of the sequence, the peak position of the echo signal is shifted. When this is gridded to a coordinate point at which no consideration is paid to the gradient magnetic field error in the calculation of the sequence, an artifact occurs. In this embodiment, the obtained data is transformed to the coordinate (K'x(θ(n),m), K'y(θ(n),m)) calculated according to the above expressions in the gridding operation, whereby the effect of the shift of the peak position of the echo signal is eliminated in the gridding operation and thus the artifact can be reduced.

Figure 13:
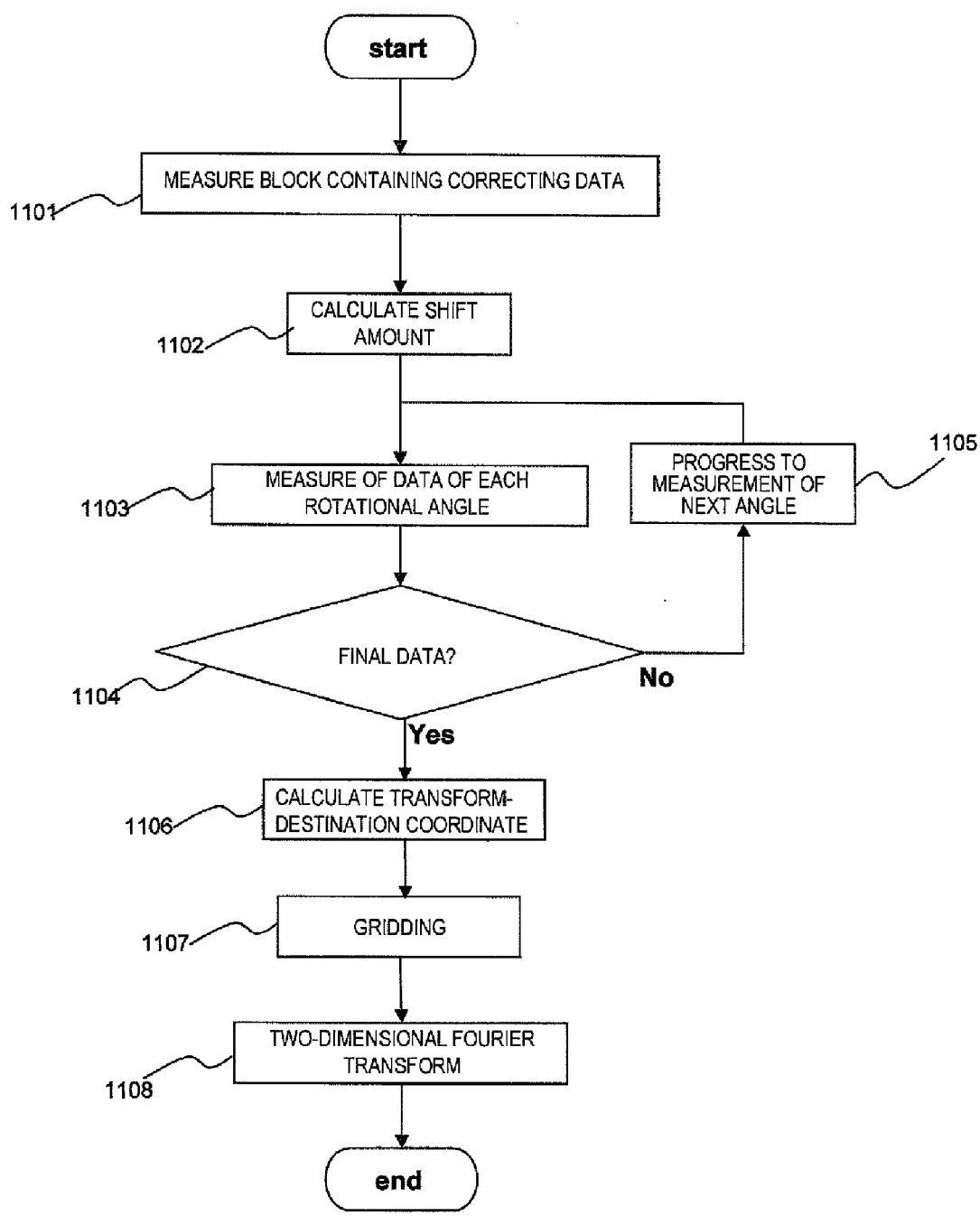
FIG. 13 is a flowchart showing the correction processing according to a third embodiment.

The procedure of the correction processing according to this embodiment will be described hereunder. FIG. 13 is a flowchart of the correction processing according to this embodiment. The difference from the respective embodiments described above resides in that gridding processing 1107 containing a correction value is provided although the signal correction processing step 104 and the step 203 of re-calculating the sequence are eliminated. The gridding processing containing the correction value is the processing of executing gridding on the coordinate calculated according to the expressions 31, 32 or the expressions 33, 34.

First, the measurement of a block containing signal correcting data is executed (step 1101). The shift amount of the peak position of the echo signal for each rotational angle data is determined by using the data obtained in step 1101 (step 1102). The measurement for all the rotational angles θ(n) is executed (steps 1103 to 1105). In this embodiment, the measurement of all the rotational angles θ(n) is executed in combination with the measurement of the block containing the signal correcting data in advance, and then, the shift amount may be determined by using the data of the block. The two blocks to be obtained are not limited to the above blocks insofar as they have different angles. The number of blocks to be obtained may be two or more, and it is not limited to two.

Subsequently, by using the shift amount obtained in the step 1102, the coordinate of the gridding destination is calculated according to the expressions 31, 32 or the expressions 33, 34 (step 1106). The measurement point is gridded to the calculated coordinate, a final measurement space is obtained (step S1107), and two-dimensional Fourier transform is executed (step 1108) to obtain a reconstructed image.

As described above, according to this embodiment, an image having little artifact can be obtained without changing the pulse sequence or executing the correction processing when an image is reconstructed.

According to the respective embodiments, in the non-orthogonal sampling methods such as the radial sampling method, the displacement of the peak of the echo signal which is caused by the gradient magnetic field error is calculated and corrected, thereby suppressing the artifact caused by the gradient magnetic field error such as disappearance of an image signal. At this time, the correcting data are obtained in time with the acquisition of the data required for the image reconstruction. Therefore, the total imaging time is not lengthened.

In the above embodiments, the measurement of the block containing the correcting data is executed in the pulse sequence for obtaining an image. However, the acquisition of the correcting data is not limited to the above style. For example, the measurement concerned may be executed as a pre-scan in advance. In this case, the pre-scan is executed every time the pulse sequence is changed.

Furthermore, in the above embodiments, the gridding is executed after the measurement of all the data is finished.

However, the gridding may be executed every time the data at each rotational angle are obtained. However, in this case, the measurement of the block containing the correcting data is executed at the initial stage of the measurement to obtain the correcting data in advance.

The present invention is not limited to the contents disclosed in the respective embodiments. Various styles may be obtained without departing from the subject matter of the present invention. Furthermore, the above embodiments have been described by using the gradient echo pulse sequence as an example. However, the radial sampling method and the hybrid radial method are not dependent on the type of the pulse sequence, and an SE pulse sequence, an FSE pulse sequence, an EPI pulse sequence or the like may be applied.

In the above embodiments, the measurement space is scanned by varying the intensity of the gradient magnetic field applied to the Gr-axis and the Gp-axis in the two-dimensional plane. The Gr-axis and the Gp-axis may correspond to any axes of X, Y, Z in the imaging space, and oblique imaging or off-center imaging may be applied. Furthermore, rotation in three-dimensional sphere may be executed.

Figure 14:
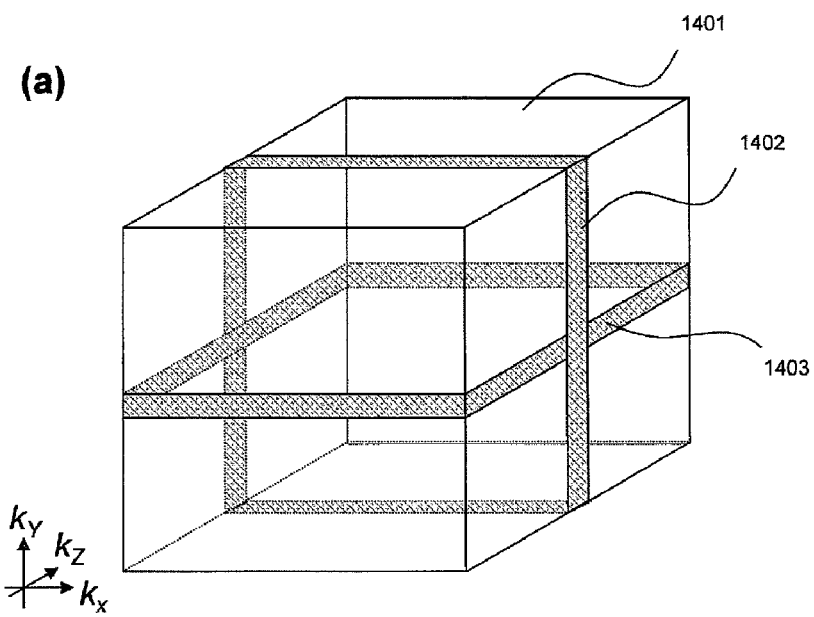
FIG. 14 is a diagram showing application to three-dimensional imaging.
Figure 14:
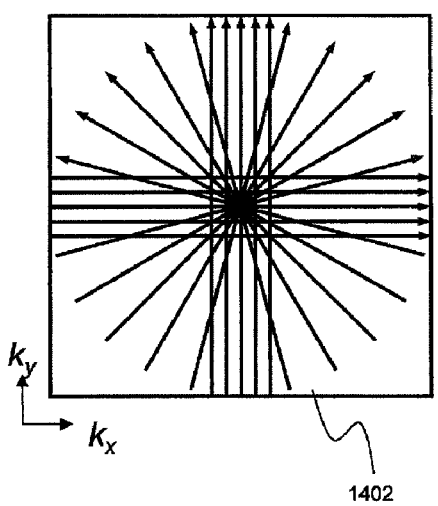
Figure 14:
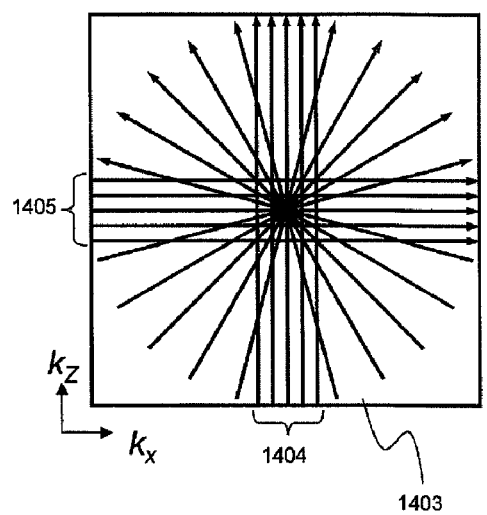

FIG. 14 is a diagram showing a case where the present invention is applied to three-dimensional imaging. Even in the case of the three-dimensional imaging, the above effect of the presents invention can be obtained by obtaining signal correcting data in the three axis directions of X, Y and Z. FIG. 14(a) shows an imaging space 1401 three-dimensionally. The gradient magnetic field offset amount and the gradient magnetic field error amount in the X and Y directions can be also obtained by acquiring the signal correcting data on a Kx-Ky plane 1402 as in the case of FIG. 8(a) (see FIG. 14(b)). Furthermore, the gradient magnetic field offset amount and the gradient magnetic field error amount in the Z direction can be obtained by acquiring the signal correcting data on a Kz-Kx plane 1403 orthogonal to the Kx-Ky plane 1402 (see FIG. 14(c)). That is, in the three-dimensional imaging, data of a blade 1404 and a blade 1405 are acquired as the signal correcting data in addition to the signal correcting data acquired in the case of the two-dimensional imaging. In the figure, the signal correcting data are obtained on the Kz-Kx plane. However, the data may be obtained on any plane insofar as the plane is orthogonal to the Kx-Ky plane 1402, and, for example, the Kz-Ky plane may be used.

In the foregoing description, a predetermined number of blocks are used in the examples of the radial sampling method and the hybrid radial method for simplification of description as described above. However, in the actual imaging, the number of blocks and the number of echoes in the block may be arbitrarily set. Likewise, with respect to the radial sampling method, the number of echoes to be obtained, the rotational angle and the number of segments may be arbitrarily set.

Furthermore, the present invention is applicable to the continuous imaging such as the dynamic imaging or the fluoroscopic imaging and an echo share method of updating some data of the measurement space under the continuous imaging as described above.

What is claimed is:

1. An magnetic resonance imaging apparatus comprising:
a measurement controller configured to control application of a gradient magnetic field and measurement of echo signals arranged in a K space on the basis of a pulse sequence of a non-cartesian sampling method;
a correcting processor configured to correct an error caused by the gradient magnetic field; and
a calculating processor configured to subject K space data to calculation processing to reconstruct an image,
wherein the measurement controller controls the application of the gradient magnetic field so as to measure a block comprising plural echo signals arranged in parallel to one another on the K space, and the correcting processor detects a shift amount of a peak position of an echo signal group of the block from an origin of the K space and correcting the error caused by the gradient magnetic field on the basis of the shift amount.

2. The magnetic resonance imaging apparatus according to claim 1, wherein the measurement controller controls application of the gradient magnetic field so as to measure plural blocks which intersect to a predetermined axis of the K space at different angles, and the correcting processor detects the shift amount for every block and corrects an error caused by the gradient magnetic field on the basis of the detected plural shift amounts.

3. The magnetic resonance imaging apparatus according to claim 2, wherein the measurement controller controls application of the gradient magnetic field so as to measure an echo signal group of a block parallel to a first axis direction and an echo signal group of a block parallel to a second axis direction on the K space.

4. The magnetic resonance imaging apparatus according to claim 2, wherein the correcting processor determines a gradient magnetic field error amount for a gradient magnetic field having an any intersecting angle to a predetermined direction by using the shift amount of each block and corrects an error caused by the gradient magnetic field of the any intersecting angle concerned on the basis of the gradient magnetic field error amount of the any angle.

5. The magnetic resonance imaging apparatus according to claim 1, wherein the correcting processor detects the shift amounts in the directions parallel and vertical to the echo signal group of the block, and corrects an error caused by the gradient magnetic field on the basis of the shift amounts in the two directions.

6. The magnetic resonance imaging apparatus according to claim 2, wherein the correction processor detects a gradient magnetic field offset of a first direction using a shift amount of the first direction and detects a gradient magnetic field error of a second direction using a shift amount of the second direction in a first block; detects a gradient magnetic field error of the first direction from the shift amount of the first direction and detects a gradient magnetic field offset of the second direction from the shift amount of the second direction in a second block perpendicular to the first block; subtracts the gradient magnetic field offset of the second direction in the second block from the gradient magnetic field error of the second direction in the first block to calculate a gradient magnetic field error other than the gradient magnetic field offset of the second direction; subtracts the gradient magnetic field offset of the first direction in the first block from the gradient magnetic field error of the first direction in the second block to calculate a gradient magnetic field error other than the gradient magnetic field offset of the first direction; and corrects an error caused by the gradient magnetic field on the basis of the gradient magnetic field offset of each of the directions and the gradient magnetic field error other than the gradient magnetic field offset.

7. The magnetic field resonance imaging apparatus according to claim 1, the measurement controller controls application of the gradient magnetic field so that the echo signal group of the block is arranged symmetrically with respect to the axis of the K space.

8. The magnetic resonance imaging apparatus according to claim 1, wherein the measurement controller controls application of the gradient magnetic field so that the position of the block is shifted in a phase encode direction of the block in correspondence to a gradient magnetic field offset obtained in advance.

9. The magnetic resonance imaging apparatus according to claim 1, wherein the measurement controller sets an interval of the echo signals of the block to be narrower than a phase encode step determined by an imaging condition.

10. The magnetic resonance imaging apparatus according to claim 1, wherein the correcting processor sifts the echo signal group arranged in the K space so that the peak position thereof is coincident with the origin of the K space on the basis of the shift amount.

11. The magnetic resonance imaging apparatus according to claim 1, wherein the calculating processor subjects the echo signal to Fourier transform, and the correcting processor executes phase correction on the Fourier-transformed echo signal on the basis of the shift amount.

12. The magnetic resonance imaging apparatus according to claim 8, wherein the correcting processor resets the gradient magnetic field on the basis of the shift amount, and the measurement controller controls the measurement of the echo signal by using the reset gradient magnetic field.

13. The magnetic resonance imaging apparatus according to claim 1, wherein the correcting processor corrects, on the basis of the shift amount, a coordinate when the echo signal group arranged in the K space is subjected to gridding, and the calculating processor grids the echo signal group arranged in the K space to the corrected coordinate, and reconstructs the image by using the gridded echo signal group.

14. A method of correcting an error caused by a gradient magnetic field in a pulse sequence of a non-cartesian sampling method by using a block comprising plural echo signals arranged in parallel to one another on a K space, comprising:
a detection step of detecting a shift amount of a peak position of an echo signal group of the block from an origin of the K space; and
a correcting step of correcting an error caused by the gradient magnetic field on the basis of the detected shift amount.

15. The method of correcting the error caused by the gradient magnetic field according to claim 14, wherein on the basis of the shift amount, the correcting step executes any one of processing of shifting the echo signal group which is measured on the basis of the pulse sequence of the non-cartesian sampling method and arranged in the K space so that the peak position of the echo signal group is coincident with the origin of the K space, processing of resetting the gradient magnetic field and processing of correcting a coordinate for gridding the echo signal group which is measured on the basis of the pulse sequence of the non-cartesian sampling method and arranged in the K space.

* * * * *